United States Patent
Nozawa et al.

(10) Patent No.: US 10,606,164 B2
(45) Date of Patent: *Mar. 31, 2020

(54) MASK BLANK, PHASE SHIFT MASK, AND METHOD FOR MANUFACTURING SEMICONDUCTOR DEVICE

(71) Applicant: HOYA CORPORATION, Tokyo (JP)

(72) Inventors: Osamu Nozawa, Tokyo (JP); Hiroaki Shishido, Tokyo (JP); Takenori Kajiwara, Tokyo (JP)

(73) Assignee: HOYA CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/136,794

(22) Filed: Sep. 20, 2018

(65) Prior Publication Data

US 2019/0018312 A1  Jan. 17, 2019

Related U.S. Application Data (62) Division of application No. 15/501,659, filed as application No. PCT/JP2016/072631 on Aug. 2, 2016, now Pat. No. 10,114,281.

(30) Foreign Application Priority Data

Aug. 14, 2015 (JP) ................ 2015-160097

(51) Int. Cl.
| | | |
|---|---|---|
| G03F 1/32 | (2012.01) | |
| G03F 1/26 | (2012.01) | |
| C23C 14/06 | (2006.01) | |
| G03F 7/20 | (2006.01) | |
| H01L 21/027 | (2006.01) | |

(52) U.S. Cl.
CPC ............. *G03F 1/32* (2013.01); *C23C 14/06* (2013.01); *C23C 14/0652* (2013.01); *G03F 1/26* (2013.01); *G03F 7/70* (2013.01); *H01L 21/0274* (2013.01)

(58) Field of Classification Search
CPC ..... G03F 1/26; G03F 1/32; G03F 7/70; C23C 14/06; H01L 21/0274
USPC .......................................... 430/5
See application file for complete search history.

(56) References Cited

U.S. PATENT DOCUMENTS

| | | |
|---|---|---|
| 5,547,787 A | 8/1996 | Ito et al. |
| 5,620,815 A | 4/1997 | Ito et al. |
| 5,679,484 A | 10/1997 | Ito et al. |
| 6,569,577 B1 | 5/2003 | Isao et al. |
| 10,114,281 B2 * | 10/2018 | Nozawa ............... C23C 14/06 |
| 2003/0180631 A1 | 9/2003 | Shiota et al. |
| 2005/0244722 A1 | 11/2005 | Okada et al. |
| 2015/0338731 A1 | 11/2015 | Nozawa et al. |

FOREIGN PATENT DOCUMENTS

| | | |
|---|---|---|
| JP | 06-83034 A | 3/1994 |
| JP | 2001-201842 A | 7/2001 |
| JP | 2003248292 A | 9/2003 |
| JP | 2005284213 A | 10/2005 |
| JP | 2010-217514 A | 9/2010 |
| JP | 2014-137388 A | 7/2014 |
| JP | 2014-145920 A | 8/2014 |
| WO | 2016/103843 A1 | 6/2016 |

OTHER PUBLICATIONS

Communication dated May 15, 2017, issued by the Korean Intellectual Property Office in corresponding Korean Application No. 10-2017-7004708.

* cited by examiner

*Primary Examiner* — Christopher G Young

(74) *Attorney, Agent, or Firm* — Kilpatrick Townsend & Stockton LLP

(57) ABSTRACT

Provided is a mask blank with a phase shift film having a function to transmit ArF exposure light at a predetermined transmittance and a function to generate a predetermined phase difference to the transmitting ArF exposure light, and having high ArF light fastness. The phase shift film has a function to transmit ArF exposure light at 2% or more transmittance and a function to generate a phase difference of 150 degrees or more and 180 degrees or less to the transmitting ArF exposure light; a lower layer and an upper layer are stacked from a substrate side; the lower layer is formed from silicon or silicon containing one or more elements selected from nonmetallic elements other than oxygen and semimetal elements; the upper layer other than a surface layer is formed from silicon and nitrogen or a material consisting of silicon, nitrogen and one or more elements selected from nonmetallic elements excluding oxygen and semimetal elements; the lower layer has refractive index n of less than 1.8 and extinction coefficient k of 2.0 or more; the upper layer has refractive index n of 2.3 or more and extinction coefficient k of 1.0 or less; and the upper layer has more thickness than the lower layer.

25 Claims, 2 Drawing Sheets

MASK BLANK, PHASE SHIFT MASK, AND METHOD FOR MANUFACTURING SEMICONDUCTOR DEVICE

CROSS REFERENCE TO RELATED APPLICATIONS

This is a Divisional of application Ser. No. 15/501,659 filed Feb. 3, 2017, claiming priority based on International Application No. PCT/JP2016/072631 filed Aug. 2, 2016, claiming priority based on Japanese Patent Application No. 2015-160097 filed Aug. 14, 2015, the contents of all of which are incorporated herein by reference in their entirety.

TECHNICAL FIELD

This invention relates to a mask blank and a phase shift mask manufactured using the mask blank. This invention further relates to a method for manufacturing a semiconductor device using the phase shift mask.

BACKGROUND ART

Generally, in a manufacturing process of a semiconductor device, photolithography is used to form a fine pattern. Multiple substrates called transfer masks are usually utilized in forming the fine pattern. In miniaturization of a semiconductor device pattern, it is necessary to shorten the wavelength of an exposure light source used in the photolithography, in addition to miniaturization of a mask pattern formed on the transfer mask. Shortening of wavelength has been advancing recently from the use of KrF excimer laser (wavelength 248 nm) to ArF excimer laser (wavelength 193 nm) as an exposure light source in the manufacture of semiconductor devices.

As for the types of the transfer mask, a half tone phase shift mask is known in addition to a conventional binary mask having a light shielding pattern made of a chromium-based material on a transparent substrate. Molybdenum silicide (MoSi)-based materials are widely used for a phase shift film of the half tone phase shift mask. However, as disclosed in Publication 1, it has been discovered recently that a MoSi-based film has low resistance to exposure light of an ArF excimer laser (so-called ArF light fastness). In Publication 1, ArF light fastness of a MoSi-based film is enhanced by subjecting the MoSi-based film after formation of the pattern under plasma treatment, UV irradiation treatment, or heat treatment to form a passivation film on a surface of the pattern of the MoSi-based film.

Publication 2 describes that the reason for low ArF light fastness of a MoSi-based film is instability of a transition metal in the film due to photoexcitation caused by irradiation of ArF excimer laser. Publication 2 applies SiNx, which is a material free of a transition metal, as a material forming a phase shift film. Publication 2 shows that, in the case of forming a single layer of SiNx film on a transparent substrate as a phase shift film, the composition of the SiNx film where optical properties required for the phase shift film can be obtained must be formed at unstable film-forming conditions (transition mode) in forming the film by reactive sputtering. To solve this technical problem, the phase shift film of Publication 2 has a stacked structure including a high transmission layer and a low transmission layer. Further, a SiN-based film formed in a poison mode region and having relatively high nitrogen content is applied to the high transmission layer, and a SiN-based film formed in a metal mode region and having relatively low nitrogen content is applied to the low transmission layer.

PRIOR ART PUBLICATIONS

Patent Publications

[Publication 1]
Japanese Patent Application Publication 2010-217514
[Publication 2]
Japanese Patent Application Publication 2014-137388

SUMMARY OF INVENTION

Problem to be Solved by the Invention

The phase shift film of the SiN-based multilayer structure disclosed in Publication 2 has a significantly improved ArF light fastness compared to a conventional phase shift film of a MoSi-based material. A CD (critical dimension) change (increase) in a width of a pattern that generates when a transfer pattern is formed on a phase shift film of a SiN-based multilayer structure and thereafter ArF exposure light is irradiated in accumulation is significantly suppressed compared to a conventional phase shift film of a MoSi-based material. However, due to reasons such as further miniaturization of transfer patterns and application of multiple patterning techniques, manufacture of a transfer mask including a phase shift mask is becoming more difficult. Further, time required to manufacture a transfer mask from a mask blank is increasing. For these reasons, price of transfer masks is increasing. Therefore, longer life for a transfer mask including a phase shift mask has been desired.

$Si_3N_4$ is a stoichiometrically stable material which is highly advantageous in ArF light fastness among materials formed from silicon and nitrogen. It is necessary for a phase shift film to have both a function to transmit an ArF exposure light entering the phase shift film at a predetermined transmittance and a function to apply a predetermined phase difference. Since refractive index n in the wavelength of an ArF exposure light is greater in $Si_3N_4$ compared to SiNx including less nitrogen content, in the case where $Si_3N_4$ is applied as a material of the phase shift film, film thickness required to apply a predetermined phase difference to ArF exposure light can be reduced. Hereinafter, refractive index n to ArF exposure light wavelength is indicated when simply referred to as refractive index n, and extinction coefficient k to ArF exposure light wavelength is indicated when simply referred to as extinction coefficient k.

The biggest reason for CD change of a phase shift pattern, which is a problem in ArF light fastness, is considered as ArF exposure light entering an interior of a phase shift film causing photoexcitation of elements constructing the phase shift film. In the case of a MoSi-based material, molybdenum(Mo) in the transition metal is likely to be photoexcited, causing significant advancement in oxidization of silicon(Si) from a surface, so that a volume of the pattern largely expands. Therefore, a phase shift film of a MoSi-based material shows significant CD change (increase) before and after irradiation of ArF exposure light. In the case of a phase shift film of a SiN-based material, CD change before and after irradiation of ArF exposure light is relatively small for being free of a transition metal. However, silicon in the phase shift film is photoexcited by irradiation of ArF exposure light, though not as significantly as transition metal.

A pattern forming thin film (including phase shift film) of a mask blank for manufacturing a phase shift mask and transfer mask is formed by sputtering under film-forming conditions to create an amorphous or microcrystalline structure. $Si_3N_4$ in a thin film of an amorphous or microcrystalline structure has a weaker bonding state than $Si_3N_4$ in a crystal film. Therefore, in a phase shift film of $Si_3N_4$ of an amorphous or microcrystalline structure, it is likely for silicon in the film to be photoexcited by irradiation of an ArF exposure light. Forming a phase shift film from a crystal film of $Si_3N_4$ can suppress silicon in the film from being photoexcited. However, forming a transfer pattern on a crystal film by dry etching causes unfavorable roughness on the pattern side walls, which goes significantly beyond LER (Line Edge Roughness) acceptable as a transfer pattern, and means that a crystal film cannot be used as a pattern forming thin film (phase shift film). For these reasons, it was difficult to achieve a phase shift mask with a longer life by simply adjusting compositions, etc. based on a phase shift film of a SiN-based material as disclosed in Publication 2.

$Si_3N_4$ is a material having large refractive index n, while having significantly small extinction coefficient k in an ArF exposure light wavelength. Therefore, when a phase shift film is formed from $Si_3N_4$ and designed to have a predetermined phase difference of slightly less than 180 degrees, only those having a high transmittance of slightly less than about 20% can be created. While it is possible to form a phase shift film with a predetermined phase difference and a predetermined transmittance by reducing nitrogen content of a SiN-based material, ArF light fastness is naturally reduced with reduction of nitrogen content. Therefore, in the case of forming a phase shift film with less transmittance than a phase shift film formed from $Si_3N_4$, it is necessary to create the phase shift film into a stacked-layer structure including a layer of $Si_3N_4$ and a layer for adjusting transmittance. However, a phase shift mask with longer life cannot be achieved by simply providing a layer for adjusting transmittance, since ArF light fastness of that layer is not high.

This invention was made to solve a conventional problem. The object of the invention is to provide a mask blank having a phase shift film on a transparent substrate, the phase shift film having a function to transmit ArF exposure light at a predetermined transmittance and a function to generate a predetermined phase difference to the transmitting ArF exposure light, the phase shift film further having higher ArF light fastness than a phase shift film formed from $Si_3N_4$. A further object is to provide a phase shift mask manufactured using this mask blank. Yet another object of this invention is to provide a method for manufacturing a semiconductor device using such a phase shift mask.

Means for Solving the Problem

To solve the above problem, this invention includes the following structures.
(Structure 1)
A mask blank including a phase shift film on a transparent substrate, in which:
the phase shift film has a function to transmit an exposure light of an ArF excimer laser at a transmittance of 2% or more and a function to generate a phase difference of 150 degrees or more and 180 degrees or less between the exposure light that transmitted through the phase shift film and the exposure light that transmitted through air for a same distance as a thickness of the phase shift film,
the phase shift film has a structure where a lower layer and an upper layer are stacked from a side of the transparent substrate,
the lower layer is formed from a material consisting of silicon, or a material consisting of silicon and one or more elements selected from nonmetallic elements other than oxygen and semimetal elements,
the upper layer, excluding a surface layer portion thereof, is formed from a material consisting of silicon and nitrogen, or a material consisting of silicon, nitrogen and one or more elements selected from nonmetallic elements excluding oxygen and semimetal elements,
the lower layer has refractive index n of less than 1.8 and extinction coefficient k of 2.0 or more,
the upper layer has refractive index n of 2.3 or more and extinction coefficient k of 1.0 or less, and
the upper layer has more thickness than the lower layer.
(Structure 2)
The mask blank according to Structure 1, in which the lower layer has a thickness of less than 12 nm.
(Structure 3)
The mask blank according to Structure 1 or 2, in which a thickness of the upper layer is five times or more than a thickness of the lower layer.
(Structure 4)
The mask blank according to any one of Structures 1 to 3, in which the lower layer is formed from a material consisting of silicon and nitrogen, or a material consisting of silicon, nitrogen and one or more elements selected from nonmetallic elements other than oxygen and semimetal elements.
(Structure 5)
The mask blank according to any one of Structures 1 to 4, in which the lower layer has nitrogen content of 40 atomic % or less.
(Structure 6)
The mask blank according to any one of Structures 1 to 5, in which a surface layer portion of the upper layer is formed from a material containing oxygen in a material forming the upper layer excluding the surface layer portion.
(Structure 7)
The mask blank according to any one of Structures 1 to 6, in which nitrogen content of the upper layer is greater than 50 atomic %.
(Structure 8)
The mask blank according to any one of Structures 1 to 7, in which the lower layer is formed in contact with a surface of the transparent substrate.
(Structure 9)
The mask blank according to any one of Structures 1 to 8 including a light shielding film on the phase shift film.
(Structure 10)
The mask blank according to Structure 9, in which the light shielding film is formed from a material containing chromium.
(Structure 11)
The mask blank according to Structure 9, in which the light shielding film is formed from a material containing transition metal and silicon.
(Structure 12)
The mask blank of Structure 9, in which the light shielding film has a structure where a layer formed from a material containing chromium and a layer formed from a material containing transition metal and silicon are stacked, in this order, from a side of the phase shift film.
(Structure 13)
A phase shift mask including a phase shift film on a transparent substrate, the phase shift film having a transfer pattern formed thereon,
the phase shift film has a function to transmit an exposure light of an ArF excimer laser at a transmittance of 2% or more and a function to generate a phase difference of 150 degrees or more and 180 degrees or less between the exposure light that transmitted through the phase shift film and the exposure light that transmitted through air for a same distance as a thickness of the phase shift film, the phase shift film has a structure where a lower layer and an upper layer are stacked from a side of the transparent substrate, the lower layer is formed from a material consisting of silicon, or a material consisting of silicon and one or more elements selected from nonmetallic elements other than oxygen and semimetal elements, the upper layer, excluding a surface layer portion thereof, is formed from a material consisting of silicon and nitrogen, or a material consisting of silicon, nitrogen and one or more elements selected from nonmetallic elements excluding oxygen and semimetal elements, the lower layer has refractive index n of less than 1.8 and extinction coefficient k of 2.0 or more, the upper layer has refractive index n of 2.3 or more and extinction coefficient k of 1.0 or less, and the upper layer has more thickness than the lower layer.

(Structure 14)

The phase shift mask according to Structure 13, in which the lower layer has a thickness of less than 12 nm.

(Structure 15)

The phase shift mask according to Structure 13 or 14, in which a thickness of the upper layer is five times or more than a thickness of the lower layer.

(Structure 16)

The phase shift mask according to any one of Structures 13 to 15, in which the lower layer is formed from a material consisting of silicon and nitrogen, or a material consisting of silicon, nitrogen and one or more elements selected from nonmetallic elements other than oxygen and semimetal elements.

(Structure 17)

The phase shift mask according to any one of Structures 13 to 16, in which the lower layer has nitrogen content of 40 atomic % or less.

(Structure 18)

The phase shift mask according to any one of Structures 13 to 17, in which a surface layer portion of the upper layer is formed from a material containing oxygen in a material forming the upper layer excluding the surface layer portion.

(Structure 19)

The phase shift mask according to any one of Structures 13 to 18, in which nitrogen content of the upper layer is greater than 50 atomic %.

(Structure 20)

The phase shift mask according to any one of Structures 13 to 19, in which the lower layer is formed in contact with a surface of the transparent substrate.

(Structure 21)

The phase shift mask according to any one of Structures 13 to 20 including a light shielding film having a light shielding pattern formed on the phase shift film.

(Structure 22)

The phase shift mask according to Structure 21, in which the light shielding film is formed from a material containing chromium.

(Structure 23)

The phase shift mask according to Structure 21, in which the light shielding film is formed from a material containing transition metal and silicon.

(Structure 24)

The phase shift mask according to Structure 21, in which the light shielding film has a structure where a layer formed from a material containing chromium and a layer formed from a material containing transition metal and silicon are stacked, in this order, from a side of the phase shift film.

(Structure 25)

The phase shift mask according to any one of Structures 21 to 24, in which a back-surface reflectance to the exposure light entering from a side of the transparent substrate in a region of the phase shift film where the light shielding film is not stacked is 35% or more.

(Structure 26)

The phase shift mask according to any one of Structures 21 to 25, in which a back-surface reflectance to the exposure light entering from a side of the transparent substrate in a region of the phase shift film where the light shielding film is stacked is 30% or more.

(Structure 27)

A method for manufacturing a semiconductor device including a step of using the phase shift mask according to any one of Structures 21 to 26 and exposure-transferring a transfer pattern on a resist film on a semiconductor substrate.

Effect of Invention

The mask blank of this invention includes a phase shift film on a transparent substrate, the phase shift film having a function of transmitting ArF exposure light at a predetermined transmittance and a function of generating a predetermined phase difference to the transmitting ArF exposure light, and at the same time capable of increasing ArF light fastness higher than a phase shift film formed from $Si_aN_4$.

EMBODIMENTS OF THE INVENTION

The embodiments of this invention are explained below. The inventors of this application made diligent studies on means having both a function for transmitting ArF exposure light at a predetermined transmittance and a function for generating a predetermined phase difference, and further enhancing ArF light fastness in a phase shift film using SiN-based material with higher ArF light fastness than MoSi-based material.

A conventional material for forming a phase shift film preferably has a refractive index n as large as possible, and an extinction coefficient k within a scope that is not too large and not too small. This is because the major design concept of the conventional phase shift film is to transmit ArF exposure light at a predetermined transmittance by absorbing the ArF exposure light inside of the phase shift film, while generating a predetermined phase difference to the transmitting ArF exposure light. In the case where a phase shift mask was manufactured by forming a pattern of a phase shift film using $Si_3N_4$ on a transparent substrate based on the design concept of the conventional phase shift film, the ArF exposure light entered from the transparent substrate side into the phase shift film is absorbed within the phase shift film, and ArF exposure light exits from the phase shift film at a predetermined transmittance. When ArF exposure light is absorbed in the phase shift film, silicon in the film is photoexcited. As the ratio of silicon photoexcited in the phase shift film increases, the ratio of silicon binding with oxygen to expand in volume increases, causing greater amount of CD change.

On the other hand, in the case where a predetermined transmittance to ArF exposure light required for the phase shift film is low and the predetermined transmittance cannot be achieved only by $Si_3N_4$ layer, it will be necessary to create the phase shift film into a stacked structure of a high transmission layer of $Si_3N_4$ with relatively high nitrogen content and a low transmission layer of SiN with relatively low nitrogen content. In this case, more ArF exposure light is absorbed when ArF exposure light transmits through the low transmission layer of SiN than when ArF exposure light transmits through the high transmission layer of $Si_3N_4$. Since the low transmission layer of SiN has low nitrogen content, silicon in the low transmission layer is more likely to be photoexcited than silicon in the high transmission layer of $Si_3N_4$, and increase of CD change in the low transmission layer is inevitable. As mentioned above, further enhancing ArF light fastness of the phase shift film of SiN-based material is difficult, even if the design concept of the conventional phase shift film is applied.

The inventors of this invention considered that light fastness of a phase shift film to ArF exposure light may be enhanced by increasing a reflectance (back-surface reflectance) at an interface between a transparent substrate and a phase shift film than conventional phase shift films so as to achieve a predetermined transmittance value of a phase shift film to ArF exposure light. When ArF exposure light enters the phase shift film from the transparent substrate side, amount of exposure light entering the interior of the phase shift film can be reduced by increasing the amount of ArF exposure light reflected at the interface between the transparent substrate and the phase shift film by more than what has been conventionally done. This allows the amount of ArF exposure light exiting from the phase shift film to be equivalent to that of the conventional phase shift film, even if the amount of ArF exposure light absorbed in the phase shift film is reduced by more than what has been conventionally done. This makes silicon within the phase shift film difficult to photoexcite, thus increasing ArF light fastness of the phase shift film.

In a phase shift film of a single layer structure, it is more difficult to increase back-surface reflectance than conventional phase shift films. Examination was made with a phase shift film of a stacked structure of a SiN-based high transmission layer and a SiN-based low transmission layer. A phase shift film with a high transmission layer of SiN having high nitrogen content and a low transmission layer of SiN having low nitrogen content was examined, and it was discovered that while a film design that satisfies the conditions of predetermined phase difference and predetermined transmittance is possible, increasing back-surface reflectance of the entire phase shift film is difficult by simply stacking these layers. SiN such as $Si_3N_4$ with high nitrogen content is a material with high refractive index n and low extinction coefficient k, where back-surface reflectance to ArF exposure light cannot be increased by applying this material to a lower layer to be arranged to the transparent substrate side of the phase shift film. Therefore, SiN such as $Si_3N_4$ with high nitrogen content was applied to an upper layer of the phase shift film.

To increase back-surface reflectance of a phase shift film to ArF exposure light, it is desired not only to increase reflection at an interface between a transparent substrate and a lower layer of the phase shift film, but also to increase reflection at an interface between the lower layer and the upper layer constructing the phase shift film. To satisfy these conditions, a material with low refractive index n and high extinction coefficient k was applied to the lower layer. SiN with low nitrogen content was applied to the lower layer of the phase shift film for having such optical properties. Namely, a mask blank was provided with a phase shift film having a structure where a lower layer of a SiN-based material with low nitrogen content and an upper layer of a SiN-based material with high nitrogen content are stacked on a transparent substrate.

Since the lower layer is formed from a material with extinction coefficient k significantly higher than the transparent substrate, ArF exposure light irradiated from the transparent substrate side is reflected at an interface between the transparent substrate and the lower layer at a light amount ratio higher than the conventional phase shift film. Since the upper layer is formed from a material with extinction coefficient k lower than the lower layer but refractive index higher than the lower layer, ArF exposure light entered into the lower layer is partially reflected at the interface between the lower layer and the upper layer. Namely, since the phase shift film as above reflects ArF exposure light at two locations, i.e., interface of the transparent substrate and the lower layer and the interface of the lower layer and the upper layer, back-surface reflectance to ArF exposure light is higher than the conventional phase shift film. By applying the new design concept as above to a phase shift film, adjusting film-forming conditions, etc. of materials forming the upper layer and the lower layer, and adjusting refractive index n, extinction coefficient k, and film thickness of the upper layer and the lower layer, a phase shift film having a predetermined transmittance and a predetermined phase difference to ArF exposure light and also achieving a predetermined back-surface reflectance was formed. It was concluded that the above technical problem can be solved by the structure of the phase shift film as stated above.

Namely, this invention is a mask blank having a phase shift film on a transparent substrate, in which the phase shift film has a function to transmit an exposure light of an ArF excimer laser at a transmittance of 2% or more and a function to generate a phase difference of 150 degrees or more and 180 degrees or less between the exposure light that transmitted through the phase shift film and the exposure light transmitted through the air for the same distance as a thickness of the phase shift film; the phase shift film has a structure where a lower layer and an upper layer are stacked from a side of the transparent substrate; the lower layer is formed from a material consisting of silicon, or a material consisting of silicon and one or more elements selected from nonmetallic elements other than oxygen and semimetal elements; the upper layer, excluding its surface layer portion, is formed from a material consisting of silicon and nitrogen, or a material consisting of silicon, nitrogen and one or more elements selected from nonmetallic elements excluding oxygen and semimetal elements; the lower layer has refractive index n of less than 1.8 and extinction coefficient k of 2.0 or more; the upper layer has refractive index n of 2.3 or more and extinction coefficient k of 1.0 or less; and the upper layer has more thickness than the lower layer.

Figure 1:
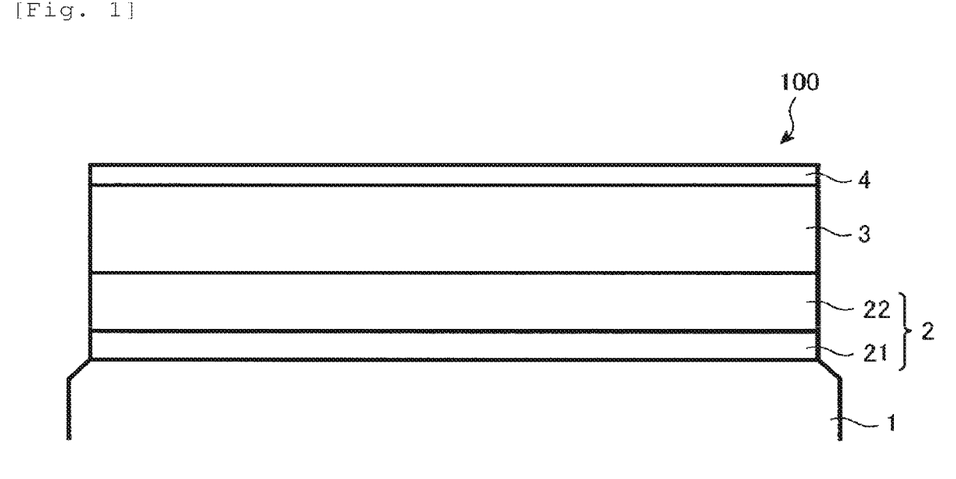
FIG. 1 is a cross-sectional view showing a structure of the mask blank according to an embodiment of this invention.

FIG. 1 is a cross-sectional view showing a structure of a mask blank 100 according to an embodiment of this invention. The mask blank 100 of this invention shown in FIG. 1 has a structure where a phase shift film 2, a light shielding film 3, and a hard mask film 4 are stacked in this order on a transparent substrate 1.

In addition to synthetic quartz glass, the transparent substrate 1 can be formed from quartz glass, aluminosilicate glass, soda-lime glass, low thermal expansion glass ($SiO_2$—$TiO_2$ glass, etc.), etc. Among the above, synthetic quartz glass is particularly preferable as a material for forming the transparent substrate 1 of the mask blank for having high transmittance to ArF excimer laser light. Refractive index n of the material forming the transparent substrate 1 to ArF exposure light wavelength (about 193 nm) is preferably 1.5 or more and 1.6 or less, more preferably 1.52 or more and 1.59 or less, and even more preferably 1.54 or more and 1.58 or less.

It is required for the phase shift film 2 that a transmittance to Arf exposure light is 2% or more. To generate sufficient phase shift effect between the exposure light transmitted through the interior of the phase shift film 2 and the exposure light transmitted through the air, at least 2% transmittance to exposure light is necessary. Transmittance of the phase shift film 2 to exposure light is preferably 3% or more, and more preferably 4% or more. On the other hand, as transmittance of the phase shift film 2 to exposure light increases, it will be more difficult to increase back-surface reflectance. Therefore, transmittance of the phase shift film 2 to exposure light is preferably 30% or less, more preferably 20% or less, and even more preferably 10% or less.

To obtain a proper phase shift effect, it is desired for the phase shift film 2 to be adjusted such that phase difference that generates between the transmitting ArF exposure light and the light that transmitted through the air for the same distance as a thickness of the phase shift film 2 is within the range of 150 degrees or more and 180 degrees or less. The lower limit of the phase difference of the phase shift film 2 is preferably 155 degrees or more, and more preferably 160 degrees or more. On the other hand, the upper limit of the phase difference of the phase shift film 2 is preferably 179 degrees or less, and more preferably 177 degrees or less. This is for the purpose of reducing an influence of increase in phase difference caused by microscopic etching of the transparent substrate 1 upon dry etching in forming a pattern on the phase shift film 2. Another reason is a recently increasing irradiation method of ArF exposure light to a phase shift mask by an exposure apparatus, in which ArF exposure light enters from a direction that is oblique at a predetermined angle to a vertical direction of a film surface of the phase shift film 2.

On the viewpoint of suppressing ArF exposure light from entering the interior of the phase shift film 2 to photoexcite silicon, the phase shift film 2 is desired to have reflectance of the transparent substrate 1 side (back-surface side) to ArF exposure light (back-surface reflectance) of at least 35% or more in the state where only the phase shift film 2 is present on the transparent substrate 1. The state where only the phase shift film 2 is present on the transparent substrate 1 indicates a state where a light shielding pattern 3b is not stacked on a phase shift pattern 2a (region of phase shift pattern 2a where light shielding pattern 3b is not stacked) when a phase shift mask 200 (FIG. 2(g)) is manufactured from this mask blank 100. On the other hand, back-surface reflectance in the state where only the phase shift film 2 is present being too high is not preferable, since greater influence will be imparted on an exposure transfer image by reflected light of the back-surface side of the phase shift film 2 when the phase shift mask 200 manufactured from this mask blank 100 was used to exposure-transfer an object to be transferred (resist film on semiconductor wafer, etc.). On this viewpoint, back-surface reflectance of the phase shift film 2 to ArF exposure light is preferably 45% or less.

The phase shift film 2 has a structure where a lower layer 21 and an upper layer 22 are stacked from the transparent substrate 1 side. It is required to at least satisfy each condition of transmittance, phase difference, and back-surface reflectance given above in the entire phase shift film 2. For the phase shift film 2 to satisfy the above conditions, refractive index n of the lower layer 21 is required to be less than 1.80. Refractive index n of the lower layer 21 is preferably 1.75 or less, and more preferably 1.70 or less. Further, refractive index n of the lower layer 21 is preferably 1.00 or more, and more preferably 1.10 or more. Extinction coefficient k of the lower layer 21 is required to be 2.00 or more. Extinction coefficient k of the lower layer 21 is preferably 2.10 or more, and more preferably 2.20 or more. Further, extinction coefficient k of the lower layer 21 is preferably 2.90 or less, and more preferably 2.80 or less. Refractive index n and extinction coefficient k of the lower layer 21 are values derived by regarding the entire lower layer 21 as a single, optically uniform layer.

For the phase shift film 2 to satisfy the above conditions, refractive index n of the upper layer 22 is required to be 2.30 or more. Refractive index n of the upper layer 22 is preferably 2.40 or more. Further, refractive index n of the upper layer 22 is preferably 2.80 or less, and more preferably 2.70 or less. Extinction coefficient k of the upper layer 22 is required to be 1.00 or less. Extinction coefficient k of the upper layer 22 is preferably 0.90 or less, and more preferably 0.70 or less. Further, extinction coefficient k of the upper layer 22 is preferably 0.20 or more, and more preferably 0.30 or more. Refractive index n and extinction coefficient k of the upper layer 22 are values derived by regarding the entire upper layer 22 including a surface layer portion to be described below as a single, optically uniform layer.

Refractive index n and extinction coefficient k of a thin film including the phase shift film 2 are not determined only by the composition of the thin film. Film density and crystal condition of thin film are also factors that affect refractive index n and extinction coefficient k. Therefore, the conditions in forming a thin film by reactive sputtering are adjusted so that the thin film reaches a desired refractive index n and extinction coefficient k. The condition for making the lower layer 21 and the upper layer within the range of refractive index n and extinction coefficient k mentioned above is not limited to adjusting the ratio of mixed gas of noble gas and reactive gas (oxygen gas, nitrogen gas, etc.) in forming the film by reactive sputtering, but includes various conditions such as pressure in a film forming chamber, power applied to the sputtering target, positional relationship between the target and the transparent substrate 1 such as distance, etc. in film formation through reactive sputtering. Further, these film forming conditions are specific to a film forming apparatus, and are adjusted arbitrarily for the lower layer 21 and the upper layer 22 to be formed to achieve desired refractive index n and extinction coefficient k.

For the phase shift film 2 to satisfy the above conditions, in addition to the optical properties of the lower layer 21 and the upper layer 22 given above, it is at least necessary that the upper layer 22 has more thickness than the lower layer 21. While a material with more nitrogen content is applied to the upper layer 22 to satisfy the desired optical properties and tends to have relatively high ArF light fastness, a material with less nitrogen content is applied to the lower layer 21 to satisfy its desired optical properties and tends to have relatively low ArF light fastness. This is because the thickness of the lower layer 21 that tends to have relatively low ArF light fastness needs to be less than the thickness of the upper layer 22 that tends to have relatively high ArF light fastness, considering that the back-surface reflectance of the phase shift film 2 is made higher for enhancing ArF light fastness of the phase shift film 2.

It is desirable that the thickness of the lower layer 21 is as small as possible within the scope capable of satisfying the conditions of predetermined transmittance, phase difference, and back-surface reflectance required for the phase shift film 2. The thickness of the lower layer 21 is preferably less than 12 nm, more preferably 11 nm or less, and even more preferably 10 nm or less. Particularly considering the back-surface reflectance of the phase shift film 2, the thickness of the lower layer 21 is preferably 3 nm or more, more preferably 4 nm or more, and even more preferably 5 nm or more.

Since the upper layer 22 is formed from a material with relatively high ArF light fastness, it is desirable that the ratio of the thickness of the upper layer 22 to the entire film thickness of the phase shift film 2 is as large as possible within the scope capable of satisfying the conditions of predetermined transmittance, phase difference, and back-surface reflectance required for the phase shift film 2. The thickness of the upper layer 22 is preferably five times or more than the thickness of the lower layer 21, more preferably 5.5 times or more, and even more preferably 6 times or more. Further, the thickness of the upper layer 22 is preferably 10 times or less than the thickness of the lower layer 21. The thickness of the upper layer 22 is preferably 80 nm or less, more preferably 70 nm or less, and even more preferably 65 nm or less. Further, the thickness of the upper layer 22 is preferably 50 nm or more, and more preferably 55 nm or more.

The lower layer 21 is formed from a material consisting of silicon, or a material consisting of silicon and one or more elements selected from nonmetallic elements excluding oxygen and semimetal elements. The lower layer 21 does not contain transition metal that may cause reduction of light fastness to ArF exposure light. It is preferable not to include metal elements excluding transition metal, since their possibility of causing reduction of light fastness to ArF exposure light cannot be denied. The lower layer 21 can contain any semimetal elements in addition to silicon. Among these semimetal elements, it is preferable to include one or more elements selected from boron, germanium, antimony, and tellurium, since enhancement in conductivity of silicon to be used as a sputtering target can be expected.

The lower layer 21 can include nonmetallic elements other than oxygen. Among the nonmetallic elements, it is preferable to include one or more elements selected from nitrogen, carbon, fluorine, and hydrogen. These nonmetallic elements include noble gas such as helium(He), argon(Ar), krypton(Kr), and xenon(Xe). Oxygen is not included in the lower layer 21 in a positive manner (oxygen content when composition analysis was made through X-ray photoelectron spectroscopy, etc. was at or less than detection lower limit). This is for the purpose of preventing significant reduction of back-surface reflectance of the phase shift film 2, since reduction of extinction coefficient k of the lower layer 21 caused by including oxygen in the material forming the lower layer 21 is greater compared to other nonmetallic elements.

The lower layer 21 is preferably formed from a material consisting of silicon and nitrogen, or a material consisting of silicon, nitrogen and one or more elements selected from nonmetallic elements excluding oxygen and semimetal elements. This is because a silicon-based material containing nitrogen has higher light fastness to ArF exposure light than a silicon-based material free of nitrogen. Another reason is that oxidation of pattern side wall is suppressed when a phase shift pattern is formed on the lower layer 21. However, as nitrogen content in the material forming the lower layer 21 increases, refractive index n becomes higher and extinction coefficient k becomes lower. Therefore, nitrogen content of the material forming the lower layer 21 is preferably 40 atomic % or less, more preferably 36 atomic % or less, and even more preferably 32 atomic % or less.

The upper layer 22, excluding its surface layer portion, is formed from a material consisting of silicon and nitrogen, or a material consisting of silicon, nitrogen and one or more elements selected from nonmetallic elements excluding oxygen and semimetal elements. The surface layer portion of the upper layer 22 indicates a surface layer portion at the opposite side of the lower layer 21 side of the upper layer 22. After forming the phase shift film 2 on the transparent substrate 1 with a film-forming apparatus, the film surface is subjected to a cleaning process. Since the surface layer portion of the upper layer 22 is exposed to cleaning liquid and rinsing liquid in the cleaning process, advancement of oxidization is inevitable regardless of compositions upon film formation. Further, oxidization of the surface layer portion of the upper layer 22 advances by exposure of the phase shift film 2 to the atmosphere and subjecting the phase shift film 2 to heat treatment in the atmosphere. As stated above, it is more preferable for the material of the upper layer 22 to have higher refractive index n. Since refractive index n tends to decrease as oxygen content in the material increases, oxygen is not included in the upper layer 22 in a positive manner upon film formation (oxygen content when composition analysis was made through X-ray photoelectron spectroscopy, etc. was at or less than detection lower limit) excluding the surface layer portion. Thus, the surface layer portion of the upper layer 22 will be formed from a material forming the upper layer excluding the surface layer portion, further including oxygen.

The surface layer portion of the upper layer 22 can be formed through various oxidization treatments. This is because the surface layer can be formed into a stable oxidized layer. The oxidization treatments include, for example, heat treatment in a gas containing oxygen such as the atmosphere, light irradiation treatment using a flash lamp, etc. in a gas containing oxygen, treatment to contact ozone and oxygen plasma on the surface of the upper layer 22, etc. It is particularly preferable to use heat treatment or irradiation treatment using a flash lamp, etc. where an effect to reduce film stress of the phase shift film 2 can be obtained simultaneously. The thickness of the surface layer portion of the upper layer 22 is preferably 1 nm or more, and more preferably 1.5 nm or more. Further, the thickness of the surface layer portion of the upper layer 22 is preferably 5 nm or less, and more preferably 3 nm or less.

The upper layer 22 does not contain transition metal that may cause reduction of light fastness to ArF exposure light. It is preferable not to include metal elements excluding transition metal, since their possibility of causing reduction of light fastness to ArF exposure light cannot be denied. The upper layer 22 can contain any semimetal elements in addition to silicon. Among these semimetal elements, it is preferable to include one or more elements selected from boron, germanium, antimony, and tellurium, since enhancement in conductivity of silicon to be used as a sputtering target can be expected.

The upper layer 22 can include nonmetallic elements other than oxygen. Among these nonmetallic elements, it is preferable to include one or more elements selected from nitrogen, carbon, fluorine, and hydrogen. These nonmetallic elements include noble gas such as helium(He), argon(Ar), krypton(Kr), and xenon(Xe). It is more preferable for the material of the upper layer 22 to have more refractive index n, and refractive index n in a silicon-based material tends to increase as nitrogen content increases. Therefore, the total content of semimetal element and nonmetallic element included in the material forming the upper layer 22 is preferably 10 atomic % or less, more preferably 5 atomic % or less, and even more preferable not to include such elements in a positive manner. On the other hand, for the above reason, it is desired for nitrogen content in the material forming the upper layer 22 to be greater than nitrogen content of the material forming at least the lower layer 21. The nitrogen content of the material forming the upper layer is preferably greater than 50 atomic %, more preferably 52 atomic % or more, and even more preferably 55 atomic % or more.

The lower layer 21 is preferably formed in contact with a surface of the transparent substrate 1. This is because a structure where the lower layer 21 contacts the surface of the transparent substrate 1 can obtain greater effect of enhancing back-surface reflectance that is generated by the stacked structure of the phase shift film 2 including the lower layer 21 and the upper layer 22 as stated above. If only slight influence is given on the effect of enhancing the back-surface reflectance of the phase shift film 2, an etching stopper film can be provided between the transparent substrate 1 and the phase shift film 2. In this case, the thickness of the etching stopper film needs to be 10 nm or less, more preferably 7 nm or less, and even more preferably 5 nm or less. On the viewpoint of an effective function as an etching stopper, the thickness of the etching stopper film needs to be 3 nm or more. Extinction coefficient k of a material forming the etching stopper film should be less than 0.1, preferably 0.05 or less, and more preferably 0.01 or less. Further, refractive index n of the material forming the etching stopper film in this case should at least be 1.9 or less, and preferably 1.7 or less. Refractive index n of a material forming the etching stopper film is preferably 1.55 or more.

It is preferable that the material forming the lower layer 21 and the material forming the upper layer 22 excluding the surface layer portion both include the same elements. The upper layer 22 and the lower layer 21 are patterned by dry etching using the same etching gas. Therefore, the upper layer 22 and the lower layer 21 are preferably etched in the same etching chamber. When the same elements are included in each material forming the upper layer 22 and the lower layer 21, environmental change in the etching chamber can be reduced when the object to be dry-etched changes from the upper layer 22 to the lower layer 21. Ratio of the etching rate of the lower layer 21 to the etching rate of the upper layer 22 when the phase shift film is patterned by dry-etching with the same etching gas is preferably 3.0 or less, and more preferably 2.5 or less. Further, ratio of the etching rate of the lower layer 21 to the etching rate of the upper layer 22 when the phase shift film 2 is patterned by dry etching with the same etching gas is preferably 1.0 or more.

While the lower layer 21 and the upper layer 22 of the phase shift film 2 are formed through sputtering, any sputtering including DC sputtering, RF sputtering, ion beam sputtering, etc. is applicable. Application of DC sputtering is preferable, considering film forming rate. In the case where the target has low conductivity, while application of RF sputtering and ion beam sputtering is preferable, application of RF sputtering is more preferable considering film forming rate.

Figure 2:
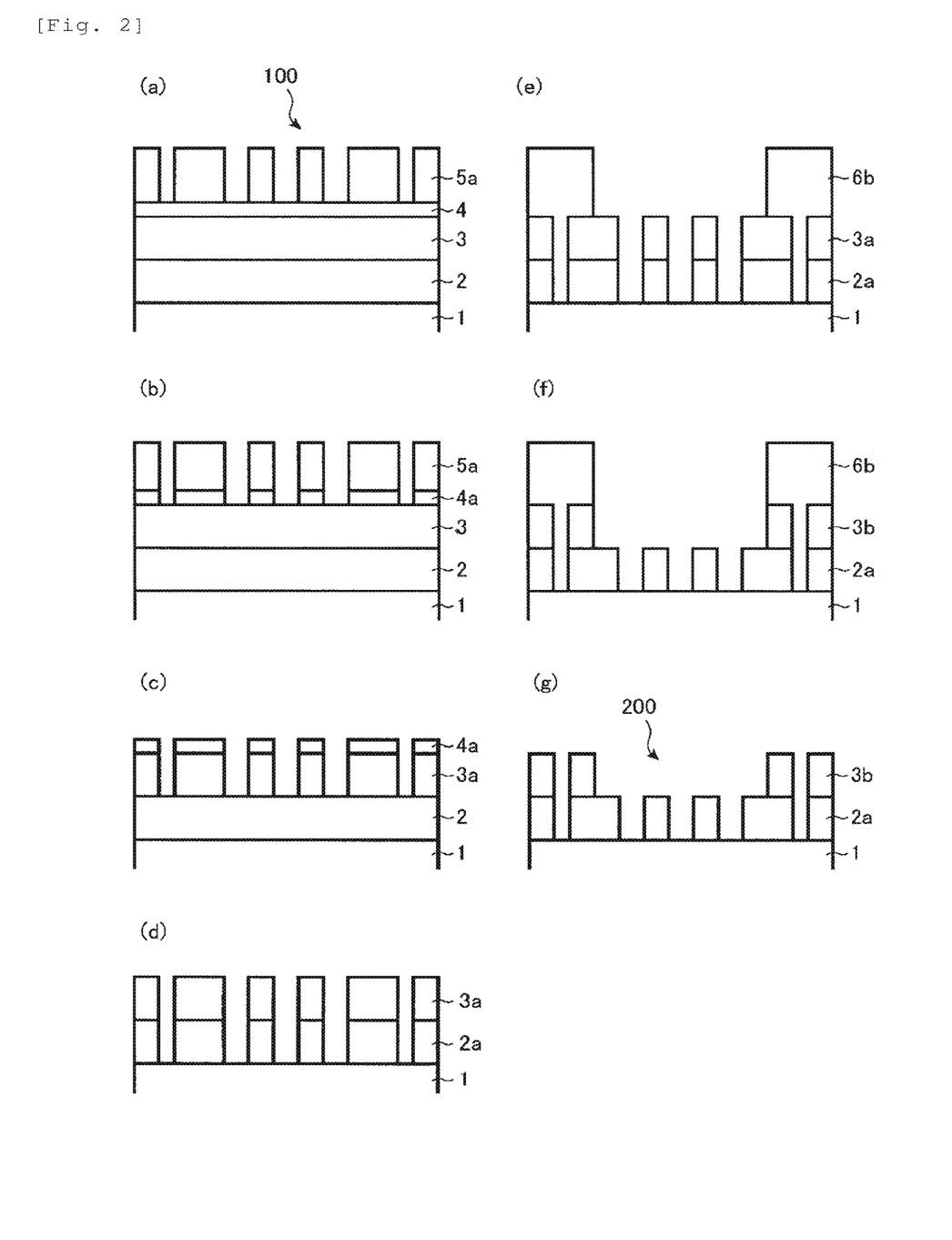
FIG. 2 is a schematic cross-sectional view showing a manufacturing process of the phase shift mask according to an embodiment of this invention.

The mask blank 100 has a light shielding film 3 on the phase shift film 2. Generally, in a binary mask, an outer peripheral region of a region where a transfer pattern is formed (transfer pattern forming region) is desired to ensure an optical density (OD) of a predetermined value or more to prevent the resist film from being subjected to an influence of an exposure light that transmitted through the outer peripheral region when an exposure transfer was made on a resist film on a semiconductor wafer using an exposure apparatus. This point is similar in the case of a phase shift mask. Generally, the outer peripheral region of a transfer mask including a phase shift mask is desired to have OD of more than 2.0, preferably 2.8 or more, and more preferably 3.0 or more. The phase shift film 2 has a function to transmit an exposure light at a predetermined transmittance, and it is difficult to ensure an optical density of a predetermined value with the phase shift film 2 alone. Therefore, it is necessary to stack the light shielding film 3 on the phase shift film 2 to ensure lacking optical density at the stage of manufacturing the mask blank 100. With such a structure of the mask blank 100, the phase shift mask 200 ensuring a predetermined value of optical density on the outer peripheral region can be manufactured by removing the light shielding film 3 of the region using the phase shift effect (basically transfer pattern forming region) during manufacture of the phase shift mask 200 (FIG. 2).

A single layer structure and a stacked structure of two or more layers are applicable to the light shielding film 3. Further, each layer in the light shielding film 3 of a single layer structure and the light shielding film 3 with a stacked structure of two or more layers may be configured by approximately the same composition in the thickness direction of the layer or the film, or with a composition gradient in the thickness direction of the layer.

The mask blank 100 in the embodiment shown in FIG. 1 is configured as a structure where the light shielding film 3 is stacked on the phase shift film 2 without an intervening film. For the light shielding film 3 in the case of this structure, it is necessary to apply a material having sufficient etching selectivity to an etching gas used in forming a pattern on the phase shift film 2. The light shielding film 3 in this case is preferably formed from a material containing chromium. Materials containing chromium for forming the light shielding film 3 can include, in addition to chromium metal, a material containing chromium and one or more elements selected from oxygen, nitrogen, carbon, boron, and fluorine.

While a chromium-based material is generally etched by a mixed gas of chlorine-based gas and oxygen gas, etching rate of the chromium metal to the etching gas is not as high. Considering enhancing etching rate of the mixed gas of chlorine-based gas and oxygen gas to etching gas, the material forming the light shielding film 3 preferably includes chromium and one or more elements selected from oxygen, nitrogen, carbon, boron, and fluorine. Further, one or more elements among molybdenum, indium, and tin may be included in the material containing chromium for forming the light shielding film 3. Including one or more elements among molybdenum, indium, and tin can increase etching rate to the mixed gas of chlorine-based gas and oxygen gas.

If an etching selectivity to dry etching for the material forming the upper layer 22 (esp., surface layer portion) can be obtained, the light shielding film 3 can be formed from a material containing transition metal and silicon. A material containing transition metal and silicon has high light shielding performance, which enables reduction of thickness of the light shielding film 3. The transition metal to be included in the light shielding film 3 includes one metal among molybdenum(Mo), tantalum(Ta), tungsten(W), titanium(Ti), chromium(Cr), hafnium(Hf), nickel(Ni), vanadium(V), zirconium(Zr), ruthenium(Ru), rhodium(Rh), zinc(Zn), niobium(Nb), palladium(Pd), etc., or an alloy of these metals. Metal elements other than the transition metal elements to be included in the light shielding film 3 include aluminum(Al), indium(In), tin(Sn), gallium(Ga), etc.

On the other hand, as a mask blank 100 of another embodiment, a light shielding film 3 of a structure including a layer of a material including chromium and a layer of a material containing transition metal and silicon stacked in this order from the phase shift film 2 side can be provided. Concrete matters on the material containing chromium and the material containing transition metal and silicon in this case is similar to the case of the light shielding film 3 described above.

It is preferable that the mask blank 100 in the state where the phase shift film 2 and the light shielding film 3 are stacked has 30% or more reflectance at the transparent substrate 1 side (back-surface side) to ArF exposure light (back-surface reflectance). In the case where the light shielding film 3 is formed from a material containing chromium and in the case where the layer of the light shielding film 3 at the phase shift film 2 side is formed from a material containing chromium, chromium is photoexcited so that chromium is likely to move to the phase shift film 2 side when a large amount of ArF exposure light enters the light shielding film 3. This movement of chromium can be suppressed by making the back-surface reflectance to ArF exposure light 30% or more in the state where the phase shift film 2 and the light shielding film 3 are stacked. Further, in the case where the light shielding film 3 is formed from a material containing transition metal and silicon, transition metal is photoexcited so that the transition metal is likely to move to the phase shift film 2 side when a large amount of ArF exposure light enters the light shielding film 3. The movement of the transition metal can be suppressed by making the back-surface reflectance to ArF exposure light 30% or more in the state where the phase shift film 2 and the light shielding film 3 are stacked.

In the mask blank 100, a preferable structure is that the light shielding film 3 has further stacked thereon a hard mask film 4 formed from a material having etching selectivity to an etching gas used in etching the light shielding film 3. Since the hard mask film 4 is not basically limited with regard to optical density, the thickness of the hard mask film 4 can be reduced significantly compared to the thickness of the light shielding film 3. Since the film thickness of a resist film of an organic material is sufficient if the film thickness functions as an etching mask until dry etching for forming a pattern on the hard mask film 4 is completed, the thickness can be reduced significantly compared to conventional resist films. Reduction of film thickness of a resist film is effective for enhancing resist resolution and preventing collapse of pattern, which is extremely important in facing requirements for miniaturization.

In the case where the light shielding film 3 is formed from a material containing chromium, the hard mask film 4 is preferably formed from a material containing silicon. Since the hard mask film 4 in this case tends to have low adhesiveness with the resist film of an organic material, it is preferable to treat the surface of the hard mask film 4 with HMDS (Hexamethyldisilazane) to enhance surface adhesiveness. The hard mask film 4 in this case is more preferably formed from $SiO_2$, SiN, SiON, etc.

Further, in the case where the light shielding film 3 is formed from a material containing chromium, materials containing tantalum are also applicable as the materials of the hard mask film 4, in addition to the above. The material containing tantalum in this case includes, in addition to tantalum metal, a material containing tantalum and one or more elements selected from nitrogen, oxygen, boron, and carbon, for example, Ta, TaN, TaO, TaON, TaBN, TaBO, TaBON, TaCN, TaCO, TaCON, TaBCN, and TaBOCN. Further, in the case where the light shielding film 3 is formed from a material containing silicon, the hard mask film 4 is preferably formed from the material containing chromium given above.

In the mask blank 100, a resist film of an organic material is preferably formed in contact with a surface of the hard mask film 4 at a film thickness of 100 nm or less. In the case of a fine pattern to meet DRAM hp32 nm generation, a SRAF (Sub-Resolution Assist Feature) with 40 nm line width may be provided on a transfer pattern (phase shift pattern) to be formed on the hard mask film 4. However, even in this case, cross-sectional aspect ratio of resist pattern can be reduced down to 1:2.5 so that collapse and falling off of the resist pattern can be prevented in rinsing and developing the resist film. The resist film preferably has a film thickness of 80 nm or less.

FIG. 2 shows a phase shift mask 200 according to an embodiment of this invention manufactured from the mask blank 100 of the above embodiment, and its manufacturing process. As shown in FIG. 2(g), the phase shift mask 200 is characterized in that a phase shift pattern 2a as a transfer pattern is formed in a phase shift film 2 of the mask blank 100, and a light shielding pattern 3b is formed in a light shielding film 3. In the case of a structure where a hard mask film 4 is provided on the mask blank 100, the hard mask film 4 is removed during manufacture of the phase shift mask 200.

The method for manufacturing the phase shift mask 200 of the embodiment of this invention uses the mask blank 100 mentioned above, which is characterized in including the steps of forming a transfer pattern on the light shielding film 3 by dry etching; forming a transfer pattern on the phase shift film 2 by dry etching with the light shielding film 3 including the transfer pattern as a mask; and forming a light shielding pattern 3b on the light shielding film 3 by dry etching with a resist film 6b including a light shielding pattern as a mask. The method for manufacturing the phase shift mask 200 of this invention is explained below according to the manufacturing steps shown in FIG. 2. Explained herein is the method for manufacturing the phase shift mask 200 using a mask blank 100 having a hard mask film 4 stacked on a light shielding film 3. Further, a material containing chromium is applied to the light shielding film 3, and a material containing silicon is applied to the hard mask film 4 in this case.

First, a resist film was formed in contact with the hard mask film 4 of the mask blank 100 by spin coating. Next, a first pattern, which is a transfer pattern (phase shift pattern) to be formed on the phase shift film 2, was exposed and drawn with an electron beam on the resist film, and a predetermined treatment such as developing was conducted, to thereby form a first resist pattern 5a having a phase shift pattern (see FIG. 2(a)). Subsequently, dry etching was conducted using fluorine-based gas with the first resist pattern 5a as a mask, and a first pattern (hard mask pattern 4a) was formed on the hard mask film 4 (see FIG. 2(b)).

Next, after removing the resist pattern 5a, dry etching was conducted using a mixed gas of chlorine-based gas and oxygen gas with the hard mask pattern 4a as a mask, and a first pattern (light shielding pattern 3a) was formed on the light shielding film 3 (see FIG. 2(c)). Subsequently, dry etching was conducted using fluorine-based gas with the light shielding pattern 3a as a mask, and a first pattern (phase shift pattern 2a) was formed on the phase shift film 2, and at the same time the hard mask pattern 4a was removed (see FIG. 2(d)).

Next, a resist film was formed on the mask blank 100 by spin coating. Next, a second pattern, which is a pattern (light shielding pattern) to be formed on the light shielding film 3, was exposed and drawn with an electron beam on the resist film, and a predetermined treatment such as developing was conducted, to thereby form a second resist pattern 6b having a light shielding pattern (see FIG. 2(e)). Subsequently, dry etching was conducted using a mixed gas of chlorine-based gas and oxygen gas with the second resist pattern 6b as a mask, and a second pattern (light shielding pattern 3b) was formed on the light shielding film 3 (see FIG. 2(f)). Further, the second resist pattern 6b was removed, and a predetermined treatment such as cleaning was conducted, so that the phase shift mask 200 was obtained (see FIG. 2(g)).

There is no particular limitation for a chlorine-based gas used for the dry etching described above, as long as Cl is included, for example, $Cl_2$, $SiCl_2$, $CHCl_3$, $CH_2Cl_2$, $CCl_4$, and $BCl_3$. Further, there is no particular limitation for a fluorine-based gas to be used for the dry etching described above, as long as F is included, for example, $CHF_3$, $CF_4$, $C_2F_8$, $C_4F_8$, and $SF_6$. Particularly, fluorine-based gas free of C can further reduce damage on a glass substrate for having a relatively low etching rate to a glass substrate.

The phase shift mask 200 of this invention is manufactured using the mask blank 100 mentioned above. Therefore, the phase shift film 2 having a transfer pattern formed thereon (phase shift pattern 2a) has a transmittance of 2% or more to ArF exposure light, and a phase difference between an exposure light transmitted through the phase shift pattern 2a and the exposure light that transmitted through the air for the same distance as the thickness of the phase shift pattern 2a of within the range of 150 degrees or more and 180 degrees or less. This phase shift mask 200 has 35% or more back-surface reflectance in a region of the phase shift pattern 2a where the light shielding pattern 3b is not stacked (region on transparent substrate 1 where only phase shift pattern 2a exists). This permits reduction in the amount of ArF exposure light entering inside of the phase shift film 2, and can suppress photoexcitation of silicon in the phase shift film 2 caused by the ArF exposure light.

The phase shift mask 200 preferably has 45% or less back-surface reflectance at a region of the phase shift pattern 2a where the light shielding pattern 3b is not stacked. This is for the purpose of preventing application of large influence on an exposure transfer image by reflected light of the back-surface side of the phase shift pattern 2a when the phase shift mask 200 was used to exposure-transfer an object to be transferred (resist film on semiconductor wafer, etc.).

The phase shift mask 200 preferably has 30% or more back-surface reflectance at a region on the transparent substrate 1 of the phase shift pattern 2a where the light shielding pattern 3b is stacked. In the case where the light shielding pattern 3b is formed from a material containing chromium and in the case where the layer at the phase shift pattern 2a side of the light shielding pattern 3b is formed from a material containing chromium, movement of chromium in the light shielding pattern 3b into the phase shift pattern 2a can be suppressed. Further, in the case where the light shielding pattern 3b is formed from a material containing transition metal and silicon, movement of the transition metal in the light shielding pattern 3b into the phase shift pattern 2a can be suppressed.

The method for manufacturing the semiconductor device of this invention is characterized in using the phase shift mask 200 given above and subjecting a resist film on a semiconductor substrate to exposure transfer of a transfer pattern. Light fastness to ArF exposure light is significantly enhanced in the phase shift pattern 2a of the phase shift mask 200. Therefore, even if the phase shift mask 200 is set on an exposure apparatus and the step of irradiating ArF exposure light from the transparent substrate 1 side of the phase shift mask 200 and exposure-transferring to an object to be transferred (resist film on semiconductor wafer etc.) is carried out continuously, the amount of CD change in the phase shift pattern 2a is small enough that a desired pattern can be transferred continuously to the object to be transferred at high precision.

EXAMPLES

The embodiments of this invention are further described concretely below along with examples.

Example 1

[Manufacture of Mask Blank]

A transparent substrate 1 formed from a synthetic quartz glass with a size of a main surface of about 152 mm×about 152 mm and a thickness of about 6.35 mm was prepared. Edge surfaces and the main surface of the transparent substrate 1 were polished to a predetermined surface roughness, and thereafter subjected to predetermined cleaning treatment and drying treatment. The optical properties of the transparent substrate 1 were measured, and refractive index n was 1.556 and extinction coefficient k was 0.00.

Next, the transparent substrate 1 was placed in a sheet-type RF sputtering apparatus, and by RF sputtering using a silicon(Si) target with argon(Ar) gas as a sputtering gas, a lower layer 21 of the phase shift film 2 formed from silicon (Si film) was formed in contact with a surface of the transparent substrate 1 at a thickness of 8 nm. Subsequently, by reactive sputtering (RF sputtering) using a silicon(Si) target with a mixed gas of argon(Ar) and nitrogen($N_2$) as a sputtering gas, an upper layer 22 of the phase shift film 2 formed from silicon and nitrogen (SiN film Si:N=43 atomic %:57 atomic %) was formed on the lower layer 21 at a thickness of 63 nm. By the above procedure, the phase shift film 2 having the lower layer 21 and the upper layer 22 stacked in contact with the surface of the transparent substrate 1 was formed at a thickness of 71 nm. The thickness of the upper layer 22 of this phase shift film 2 is 7.9 times the thickness of the lower layer 21. The composition of the lower layer 21 and the upper layer 22 is the result obtained from measurement by X-ray photoelectron spectroscopy (XPS). The same applies to other films hereafter.

Next, to reduce film stress of the phase shift film 2 and to form an oxidized layer on the surface layer portion, the transparent substrate 1 having formed the phase shift film 2 was subjected to heat treatment. Transmittance and phase difference of the phase shift film 2 to a light of 193 nm wavelength were measured using a phase shift measurement device (MPM193 manufactured by Lasertec), resulting in a transmittance of 6.1% and phase difference of 177.0 degrees.

Further, the phase shift film 2 was analyzed by STEM (Scanning Electron Microscope) and EDX (Energy Dispersive X-Ray Spectroscopy) and formation of an oxidization layer was confirmed on the surface layer portion at a thickness of about 2 nm from the surface of the upper layer 22. Moreover, the optical properties were measured for each of the lower layer 21 and the upper layer 22 of the phase shift film 2, and the lower layer 21 had refractive index n of 1.06 and extinction coefficient k of 2.72, and the upper layer 22 had refractive index n of 2.63 and extinction coefficient k of 0.37. Back-surface reflectance (reflectance at transparent substrate 1 side) of the phase shift film 2 to a light of 193 nm wavelength was 44.1%.

Next, the transparent substrate 1 having the phase shift film 2 formed thereon was placed in a sheet-type DC sputtering apparatus, and by reactive sputtering (DC sputtering) using a chromium(Cr) target with a mixed gas of argon(Ar), carbon dioxide($CO_2$), nitrogen($N_2$), and helium (He) as a sputtering gas, a light shielding film 3 formed from CrOCN (CrOCN film:Cr:O:C:N=55 atomic %:22 atomic %:12 atomic %:11 atomic %) was formed on the phase shift film 2 at a thickness of 46 nm. Back-surface reflectance (reflectance at transparent substrate 1 side) to a light of 193 nm wavelength in the state where the phase shift film 2 and the light shielding film 3 are stacked on the transparent substrate 1 was 42.7%. The optical density (OD) to a light of 193 nm wavelength in the stacked structure of the phase shift film 2 and the light shielding film 3 was 3.0 or more. Further, another transparent substrate 1 was prepared, only a light shielding film 3 was formed under the same film-forming conditions, the optical properties of the light shielding film 3 were measured, and refractive index n was 1.95 and extinction coefficient k was 1.53.

Next, the transparent substrate 1 with the phase shift film 2 and the light shielding film 3 stacked thereon was placed in a sheet-type RF sputtering apparatus, and by RF sputtering using a silicon dioxide ($SiO_2$) target with argon(Ar) gas as a sputtering gas, a hard mask film 4 formed from silicon and oxygen was formed on the light shielding film 3 at a thickness of 5 nm. Through the above procedure, the mask blank 100 having a structure where the phase shift film 2 of a two-layer structure, the light shielding film 3, and the hard mask film 4 are stacked on the transparent substrate 1 was manufactured.

[Manufacture of Phase Shift Mask]

Next, the phase shift mask 200 of Example 1 was manufactured through the following procedure using the mask blank 100 of Example 1. First, a surface of the hard mask film 4 was subjected to HMDS treatment. Subsequently, a resist film of a chemically amplified resist for electron beam writing was formed in contact with a surface of the hard mask film 4 by spin coating at a film thickness of 80 nm. Next, a first pattern, which is a phase shift pattern to be formed on the phase shift film 2, was drawn on the resist film with electron beam, predetermined cleaning and developing treatments were conducted, and a first resist pattern 5a having the first pattern was formed (FIG. 2(a)).

Next, dry etching using $CF_4$ gas was conducted with the first resist pattern 5a as a mask, and the first pattern (hard mask pattern 4a) was formed in the hard mask film 4 (FIG. 2(b)). Thereafter the first resist pattern 5a was removed.

Subsequently, dry etching was conducted using a mixed gas of chlorine and oxygen (gas flow ratio $Cl_2:O_2$=10:1) with the hard mask pattern 4a as a mask, and a first pattern (light shielding pattern 3a) was formed on the light shielding film 3 (see FIG. 2(c)). Next, dry etching was conducted using fluorine-based gas ($SF_6$+He) with the light shielding pattern 3a as a mask, and a first pattern (phase shift pattern 2a) was formed on the phase shift film 2, and at the same time the hard mask pattern 4a was removed (FIG. 2(d)).

Next, a resist film of a chemically amplified resist for electron beam writing was formed on the light shielding pattern 3a by spin coating at a film thickness of 150 nm. Next, a second pattern, which is a pattern (light shielding pattern) to be formed on the light shielding film, was exposed and drawn on the resist film, further subjected to predetermined treatments such as developing, and a second resist pattern 6b having the light shielding pattern was formed (FIG. 2(e)). Subsequently, dry etching was conducted using a mixed gas of chlorine and oxygen (gas flow ratio $Cl_2:O_2$=4:1) with the second resist pattern 6b as a mask, and a second pattern (light shielding pattern 3b) was formed on the light shielding film 3 (FIG. 2(f)). Further, the second resist pattern 6b was removed, predetermined treatment such as cleaning was carried out, and the phase shift mask 200 was obtained (FIG. 2(g)). The ratio of etching rate of the lower layer 21 to etching rate of the upper layer 22 when dry etching using $SF_6$+He was conducted on the phase shift film 2 was 2.06.

A region of the phase shift pattern 2a where the light shielding pattern 3b is not stacked in the manufactured half tone phase shift mask 200 of Example 1 was subjected to irradiation treatment where ArF excimer laser light was intermittently irradiated until accumulated irradiation amount reached 40 kJ/$cm^2$. Amount of CD change in the phase shift pattern 2a before and after this irradiation treatment was 1.5 nm. The amount of CD change has been improved compared to the amount of CD change in a phase shift pattern formed from a single layer structure of $Si_3N_4$ before and after the same irradiation treatment (3.2 nm).

A simulation was made on an exposure transfer image of the phase shift mask 200 after irradiation treatment of ArF excimer laser light using AIMS193 (manufactured by Carl Zeiss) on when exposure transfer was made on a resist film on a semiconductor device with an exposure light of 193 nm wavelength. The exposure transfer image obtained by the simulation was inspected, recognizing that the design specification was fully satisfied. It can be considered from the above that exposure transfer can be made on the resist film on the semiconductor device at high precision, even if the phase shift mask 200 manufactured from the mask blank of Example 1 was set on an exposure apparatus and subjected to exposure transfer by exposure light of ArF excimer laser until accumulated irradiation amount reached 40 kJ/$cm^2$.

On the other hand, a region of the phase shift pattern 2a where the light shielding pattern 3b is stacked in the half tone phase shift mask 200 of Example 1 was subjected to irradiation treatment where ArF excimer laser light was intermittently irradiated until accumulated irradiation amount reached 40 kJ/$cm^2$. Secondary ion mass spectrometry (SIMS) was conducted on the phase shift pattern 2a of the region subjected to irradiation treatment, and the phase shift pattern 2a had slight chromium content. It can be considered from this result that the phase shift mask 200 manufactured from the mask blank of Example 1 can sufficiently suppress movement of chromium in the light shielding pattern 3b into the phase shift pattern 2a when exposure light of ArF excimer laser is irradiated on the phase shift pattern 2a on which the light shielding pattern 3b is stacked.

Example 2

[Manufacture of Mask Blank]

The mask blank 100 of Example 2 was manufactured through the same procedure as Example 1, except for a phase shift film 2. The changes made in the phase shift film 2 of Example 2 are the material forming the lower layer 21 and its film thickness, and the film thickness of the upper layer 22. Concretely, a transparent substrate 1 was placed in a sheet-type RF sputtering apparatus, and by reactive sputtering (RF sputtering) using a silicon(Si) target with a mixed gas of argon(Ar) and nitrogen($N_2$) as a sputtering gas, a lower layer 21 of the phase shift film 2 formed from silicon and nitrogen (SiN film Si:N=68 atomic %:32 atomic %) was formed in contact with a surface of the transparent substrate 1 at a thickness of 9 nm. Subsequently, by reactive sputtering (RF sputtering) using a silicon(Si) target with a mixed gas of argon(Ar) and nitrogen($N_2$) as a sputtering gas, an upper layer 22 of the phase shift film 2 formed from silicon and nitrogen (SiN film Si:N=43 atomic %:57 atomic %) was formed on the lower layer 21 at a thickness of 59 nm. By the above procedure, the phase shift film 2 having the lower layer 21 and the upper layer 22 stacked in contact with the surface of the transparent substrate 1 was formed at a thickness of 68 nm. In this phase shift film 2, the thickness of the upper layer 22 is 6.6 times the thickness of the lower layer 21.

Further, the phase shift film 2 of Example 2 was also subjected to heat treatment under the same treatment conditions as Example 1. Transmittance and phase difference of the phase shift film 2 to a light of 193 nm wavelength were measured using a phase shift measurement device (MPM193 manufactured by Lasertec), and transmittance was 6.1% and phase difference was 177.0 degrees. Further, the phase shift film 2 was analyzed by STEM and EDX, and formation of an oxidization layer was confirmed on the surface layer portion at a thickness of about 2 nm from the surface of the upper layer 22. Moreover, the optical properties were measured for each of the lower layer 21 and the upper layer 22 of the phase shift film 2, and the lower layer 21 had refractive index n of 1.48 and extinction coefficient k of 2.35, and the upper layer 22 had refractive index n of 2.63 and extinction coefficient k of 0.37. Back-surface reflectance (reflectance at transparent substrate 1 side) of the phase shift film 2 to light of 193 nm wavelength was 39.5%.

By the above procedure, the mask blank 100 of Example 2 was manufactured, the mask blank 100 having a structure in which the phase shift film 2 including the lower layer 21 of SiN and the upper layer 22 of SiN, the light shielding film 3, and the hard mask film 4 are stacked on the transparent substrate 1. In the mask blank 100 of Example 2, back-surface reflectance (reflectance at transparent substrate 1 side) to light of 193 nm wavelength with the phase shift film and the light shielding film 3 stacked on the transparent substrate 1 was 37.6%. The optical density (OD) of the stacked structure of the phase shift film 2 and the light shielding film 3 to a light of 193 nm wavelength was 3.0 or more.

[Manufacture of Phase Shift Mask]

Next, a phase shift mask 200 of Example 2 was manufactured through the same procedure as Example 1 using the mask blank 100 of Example 2. The ratio of etching rate of the lower layer 21 to the etching rate of the upper layer 22 when the phase shift film 2 was subjected to dry etching using $SF_6$+He was 1.09.

A region of the phase shift pattern 2a where the light shielding pattern 3b is not stacked in the manufactured half tone phase shift mask 200 of Example 2 was subjected to irradiation treatment where ArF excimer laser light was intermittently irradiated until accumulated irradiation amount reached 40 kJ/cm². Amount of CD change in the phase shift pattern 2a before and after this irradiation treatment was 1.8 nm. The amount of CD change has been improved compared to the amount of CD change in a phase shift pattern formed from a single layer structure of $Si_3N_4$ before and after the same irradiation treatment (3.2 nm).

Further, a simulation was made on an exposure transfer image of the phase shift mask 200 after being subjected to the irradiation treatment of ArF excimer laser light using AIMS193 (manufactured by Carl Zeiss) on when exposure transfer was made on a resist film on a semiconductor device with an exposure light of 193 nm wavelength. The exposure transfer image obtained by this simulation was inspected, recognizing that the design specification was fully satisfied. It can be considered from this result that a highly precise exposure transfer can be made on a resist film on a semiconductor device, even if the phase shift mask 200 manufactured from the mask blank of Example 2 was set on an exposure apparatus and exposure transfer by exposure light of ArF excimer laser was made until accumulated irradiation amount reaches 40 kJ/cm².

On the other hand, a region of the phase shift pattern 2a where the light shielding pattern 3b is stacked in the half tone phase shift mask 200 of Example 2 was subjected to irradiation treatment where ArF excimer laser light was intermittently irradiated until accumulated irradiation amount reached 40 kJ/cm². Secondary ion mass spectrometry (SIMS) was conducted on the phase shift pattern 2a of the region subjected to irradiation treatment, and the phase shift pattern 2a had slight chromium content. It can be considered from this result that the phase shift mask 200 manufactured from the mask blank 100 of Example 2 can sufficiently suppress movement of chromium in the light shielding pattern 3b into the phase shift pattern 2a when exposure light of ArF excimer laser is irradiated on the phase shift pattern 2a on which the light shielding pattern 3b is stacked.

Example 3

[Manufacture of Mask Blank]

The mask blank 100 of Example 3 was manufactured through the same procedure as Example 1, except for a phase shift film 2. The changes made in the phase shift film 2 of Example 3 are the material forming the lower layer 21 and its film thickness, and the film thickness of the upper layer 22. Concretely, a transparent substrate 1 was placed in a sheet-type RF sputtering apparatus, and by reactive sputtering (RF sputtering) using a silicon(Si) target with a mixed gas of argon(Ar) and nitrogen($N_2$) as a sputtering gas, a lower layer 21 of the phase shift film 2 formed from silicon and nitrogen (SiN film Si:N=64 atomic %:36 atomic %) was formed in contact with the surface of the transparent substrate 1 at a thickness of 10 nm. Subsequently, by reactive sputtering (RF sputtering) using a silicon(Si) target with a mixed gas of argon(Ar) and nitrogen($N_2$) as a sputtering gas, an upper layer 22 of the phase shift film 2 formed from silicon and nitrogen (SiN film Si:N=43 atomic %:57 atomic %) was formed on the lower layer 21 at a thickness of 58 nm. By the above procedure, the phase shift film 2 with the lower layer 21 and the upper layer 22 stacked in contact with the surface of the transparent substrate 1 was formed at a thickness of 68 nm. The thickness of the upper layer 22 of this phase shift film 2 is 5.8 times the thickness of the lower layer 21.

Further, the phase shift film 2 of Example 3 was subjected to heat treatment under the same treatment conditions as Example 1. Transmittance and phase difference of the phase shift film 2 to a light of 193 nm wavelength were measured using a phase shift measurement device (MPM193 manufactured by Lasertec), resulting in transmittance of 6.1% and phase difference of 177.0 degrees. Further, the phase shift film 2 was analyzed by STEM and EDX, and formation of an oxidization layer was confirmed on the surface layer portion at a thickness of about 2 nm from the surface of the upper layer 22. Moreover, the optical properties of each of the lower layer 21 and the upper layer 22 of the phase shift film 2 were measured, and the lower layer 21 had refractive index n of 1.62 and extinction coefficient k of 2.18, and the upper layer 22 had refractive index n of 2.63 and extinction coefficient k of 0.37. Back-surface reflectance (reflectance at transparent substrate 1 side) of the phase shift film 2 to light of 193 nm wavelength was 37.8%.

By the above procedure, the mask blank 100 of Example 3 was manufactured, the mask blank 100 having a structure in which the phase shift film 2 including the lower layer 21 of SiN and the upper layer 22 of SiN, the light shielding film 3, and the hard mask film 4 are stacked on the transparent substrate 1. In the mask blank 100 of Example 3, back-surface reflectance (reflectance at transparent substrate 1 side) to light of 193 nm wavelength with the phase shift film 2 and the light shielding film 3 stacked on the transparent substrate 1 was 35.8%. The optical density (OD) of the stacked structure of the phase shift film 2 and the light shielding film 3 to a light of 193 nm wavelength was 3.0 or more.

[Manufacture of Phase Shift Mask]

Next, a phase shift mask 200 of Example 3 was manufactured through the same procedure as Example 1 using the mask blank 100 of Example 3. The ratio of etching rate of the lower layer 21 to the etching rate of the upper layer 22 when the phase shift film 2 was subjected to dry etching using $SF_6$+He was 1.04.

A region of the phase shift pattern 2a where the light shielding pattern 3b is not stacked in the manufactured half tone phase shift mask 200 of Example 3 was subjected to irradiation treatment where ArF excimer laser light was intermittently irradiated until accumulated irradiation amount reached 40 kJ/cm². Amount of CD change in the phase shift pattern 2a before and after this irradiation treatment was 2.0 nm. The amount of CD change has been improved compared to the amount of CD change in a phase shift pattern formed from a single layer structure of $Si_3N_4$ before and after the same irradiation treatment (3.2 nm).

A simulation was made on an exposure transfer image of the phase shift mask 200 after irradiation treatment of ArF excimer laser light using AIMS193 (manufactured by Carl Zeiss) on when exposure transfer was made on a resist film on a semiconductor device with an exposure light of 193 nm wavelength. The exposure transfer image obtained by the simulation was inspected, recognizing that the design specification was fully satisfied. It can be considered from the above that exposure transfer can be made on the resist film on the semiconductor device at high precision, even if the phase shift mask 200 manufactured from the mask blank of Example 3 was set on an exposure apparatus and subjected to exposure transfer by exposure light of ArF excimer laser until accumulated irradiation amount reaches 40 kJ/cm².

On the other hand, a region of the phase shift pattern 2a where the light shielding pattern 3b is stacked in the half tone phase shift mask 200 of Example 3 was subjected to irradiation treatment where ArF excimer laser light was intermittently irradiated until accumulated irradiation amount reached 40 kJ/cm². Secondary ion mass spectrometry (SIMS) was conducted on the phase shift pattern 2a of the region subjected to irradiation treatment, and the phase shift pattern 2a had slight chromium content. It can be considered from this result that the phase shift mask 200 manufactured from the mask blank 100 of Example 3 can sufficiently suppress movement of chromium in the light shielding pattern 3b into the phase shift pattern 2a when exposure light of ArF excimer laser is irradiated on the phase shift pattern 2a on which the light shielding pattern 3b is stacked.

Example 4

[Manufacture of Mask Blank]

The mask blank 100 of Example 4 was manufactured through the same procedure as Example 1, except for a phase shift film 2. The changes made in the phase shift film 2 of Example 4 are the material forming the lower layer 21 and its film thickness, and the film thickness of the upper layer 22. Concretely, a transparent substrate 1 was placed in a sheet-type RF sputtering apparatus, and by reactive sputtering (RF sputtering) using a silicon(Si) target with a mixed gas of argon(Ar) and nitrogen($N_2$) as a sputtering gas, a lower layer 21 of the phase shift film 2 formed from silicon and nitrogen (SiN film Si:N=60 atomic %:40 atomic %) was formed in contact with the surface of the transparent substrate 1 at a thickness of 11 nm. Subsequently, by reactive sputtering (RF sputtering) using a silicon(Si) target with a mixed gas of argon(Ar) and nitrogen($N_2$) as a sputtering gas, an upper layer 22 of the phase shift film 2 formed from silicon and nitrogen (SiN film Si:N=43 atomic %:57 atomic %) was formed on the lower layer 21 at a thickness of 56 nm. By the above procedure, the phase shift film 2 with the lower layer 21 and the upper layer 22 stacked in contact with the surface of the transparent substrate 1 was formed at a thickness of 67 nm. The thickness of the upper layer 22 of this phase shift film 2 is 5.1 times the thickness of the lower layer 21.

Further, the phase shift film 2 of Example 4 was subjected to heat treatment under the same treatment conditions as Example 1. Transmittance and phase difference of the phase shift film 2 to a light of 193 nm wavelength were measured using a phase shift measurement device (MPM193 manufactured by Lasertec), resulting in transmittance of 6.1% and phase difference of 177.0 degrees. Further, the phase shift film 2 was analyzed by STEM and EDX, and formation of an oxidization layer was confirmed on the surface layer portion at a thickness of about 2 nm from the surface of the upper layer 22. Moreover, the optical properties of each of the lower layer 21 and the upper layer 22 of the phase shift film 2 were measured, and the lower layer 21 had refractive index n of 1.76 and extinction coefficient k of 2.00, and the upper layer 22 had refractive index n of 2.63 and extinction coefficient k of 0.37. Back-surface reflectance (reflectance at transparent substrate 1 side) of the phase shift film 2 to light of 193 nm wavelength was 35.4%.

By the above procedure, the mask blank 100 of Example 4 was manufactured, the mask blank 100 having a structure in which the phase shift film 2 including the lower layer 21 of SiN and the upper layer 22 of SiN, the light shielding film 3, and the hard mask film 4 are stacked on the transparent substrate 1. In the mask blank 100 of Example 4, back-surface reflectance (reflectance at transparent substrate 1 side) to light of 193 nm wavelength with the phase shift film and the light shielding film 3 stacked on the transparent substrate 1 was 33.3%. The optical density (OD) of the stacked structure of the phase shift film 2 and the light shielding film 3 to a light of 193 nm wavelength was 3.0 or more.

[Manufacture of Phase Shift Mask]

Next, a phase shift mask 200 of Example 4 was manufactured through the same procedure as Example 1 using the mask blank 100 of Example 4. The ratio of etching rate of the lower layer 21 to the etching rate of the upper layer 22 when the phase shift film 2 was subjected to dry etching using $SF_6$+He was 1.00.

A region of the phase shift pattern 2a where the light shielding pattern 3b is not stacked in the manufactured half tone phase shift mask 200 of Example 4 was subjected to irradiation treatment where ArF excimer laser light was intermittently irradiated until accumulated irradiation amount reached 40 kJ/cm$^2$. Amount of CD change in the phase shift pattern 2a before and after this irradiation treatment was 2.4 nm. The amount of CD change has been improved compared to the amount of CD change in a phase shift pattern formed from a single layer structure of $Si_3N_4$ before and after the same irradiation treatment (3.2 nm).

Further, a simulation was made on an exposure transfer image of the phase shift mask 200 after being subjected to the irradiation treatment of ArF excimer laser light using AIMS193 (manufactured by Carl Zeiss) on when exposure transfer was made on a resist film on a semiconductor device with an exposure light of 193 nm wavelength. The exposure transfer image obtained by this simulation was inspected, recognizing that the design specification was fully satisfied. It can be considered from this result that a highly precise exposure transfer can be made on a resist film on a semiconductor device, even if the phase shift mask 200 manufactured from the mask blank of Example 4 was set on an exposure apparatus and exposure transfer by exposure light of ArF excimer laser was made until accumulated irradiation amount reaches 40 kJ/cm$^2$.

On the other hand, a region of the phase shift pattern 2a where the light shielding pattern 3b is stacked in the half tone phase shift mask 200 of Example 4 was subjected to irradiation treatment where ArF excimer laser light was intermittently irradiated until accumulated irradiation amount reached 40 kJ/cm$^2$. Secondary ion mass spectrometry (SIMS) was conducted on the phase shift pattern 2a of the region subjected to irradiation treatment, and the phase shift pattern 2a had slight chromium content. It can be considered from this result that the phase shift mask 200 manufactured from the mask blank 100 of Example 4 can sufficiently suppress movement of chromium in the light shielding pattern 3b into the phase shift pattern 2a when exposure light of ArF excimer laser is irradiated on the phase shift pattern 2a on which the light shielding pattern 3b is stacked.

Example 5

[Manufacture of Mask Blank]

The mask blank 100 of Example 5 was manufactured through the same procedure as Example 1, except for a light shielding film 3 and a hard mask film 4. The light shielding film 3 of Example 5 has a two-layer structure of a lower layer and an upper layer, and includes molybdenum-silicide-based material for the materials forming the lower layer and the upper layer. Concretely, a transparent substrate 1 with a phase shift film 3 formed thereon was placed in a sheet-type DC sputtering apparatus, and by reactive sputtering (DC sputtering) using a mixed target of molybdenum(Mo) and silicon(Si) (Mo:Si=13 atomic %:87 atomic %) with a mixed gas of argon(Ar) and nitrogen($N_2$) as a sputtering gas, a lower layer of the light shielding film 3 formed from molybdenum, silicon, and nitrogen (MoSiN film Mo:Si:N=8 atomic %:62 atomic %:30 atomic %) was formed in contact with a surface of the upper layer 22 of the phase shift film at a thickness of 27 nm. Subsequently, by reactive sputtering (DC sputtering) using a mixed target of molybdenum(Mo) and silicon(Si) (Mo:Si=13 atomic %:87 atomic %) with a mixed gas of argon(Ar), oxygen($O_2$), and nitrogen($N_2$) as a sputtering gas, an upper layer of the light shielding film 3 formed from molybdenum, silicon, nitrogen, and oxygen (MoSiON film Mo:Si:O:N=6 atomic %:54 atomic %:3 atomic %:37 atomic %) was formed in contact with a surface of the lower layer of the light shielding film 3 at a thickness of 13 nm. By the above procedure, the light shielding film 3 with the lower layer and the upper layer stacked in contact with the surface of the phase shift film 2 was formed at a thickness of 40 nm.

Optical density (OD) of the stacked structure of the phase shift film 2 and the light shielding film 3 to light of 193 nm wavelength was 3.0 or more. Further, another transparent substrate 1 was prepared, only the lower layer of the light shielding film 3 was formed under the same film-forming conditions, the optical properties of the lower layer of the light shielding film 3 were measured, and refractive index n was 2.23 and extinction coefficient k was 2.07. Similarly, another transparent substrate 1 was prepared, only the upper layer of the light shielding film 3 was formed under the same film-forming conditions, the optical properties of the upper layer of the light shielding film 3 were measured, and refractive index n was 2.33 and extinction coefficient k was 0.94.

The hard mask film 4 of Example 5 uses a chromium-based material. Concretely, a transparent substrate 1 with a phase shift film 3 and a light shielding film 4 formed thereon was placed in a sheet-type DC sputtering apparatus, and by reactive sputtering (DC sputtering) using a chromium(Cr) target with a mixed gas of argon(Ar) and nitrogen($N_2$) as a sputtering gas, a hard mask film 4 formed from chromium and nitrogen (CrN film Cr:N=75 atomic %:25 atomic %) was formed in contact with a surface of the upper layer of the light shielding film 3 at a thickness of 5 nm.

By the above procedure, the mask blank 100 of Example 5 was manufactured, the mask blank 100 having a structure in which the phase shift film 2 including the lower layer 21 of SiN and the upper layer 22 of SiN, the light shielding film 3 including the lower layer of MoSiN and the upper layer of MoSiON, and the hard mask film 4 of CrN are stacked on the transparent substrate 1. In the mask blank 100 of Example 5, back-surface reflectance (reflectance at transparent substrate 1 side) to light of 193 nm wavelength with the phase shift film 2 and the light shielding film 3 stacked on the transparent substrate 1 was 43.1%.

[Manufacture of Phase Shift Mask]

Next, a phase shift mask 200 of Example 5 was manufactured through the same procedure as Example 1 using the mask blank 100 of Example 5, except for application of fluorine-based gas ($SF_6$+He) as an etching gas for use in dry etching of the light shielding film 3, and a mixed gas of chlorine and oxygen ($Cl_2$+$O_2$) as an etching gas for use in dry etching of the hard mask film 4.

A region of the phase shift pattern 2a where the light shielding pattern 3b is not stacked in the manufactured half tone phase shift mask 200 of Example 5 was subjected to irradiation treatment where ArF excimer laser light was intermittently irradiated until accumulated irradiation amount reached 40 kJ/cm$^2$. Amount of CD change in the phase shift pattern 2a before and after this irradiation treatment was 1.5 nm. The amount of CD change has been improved compared to the amount of CD change in a phase shift pattern formed from a single layer structure of $Si_3N_4$ before and after the same irradiation treatment (3.2 nm).

Further, a simulation was made on an exposure transfer image of the phase shift mask 200 after being subjected to the irradiation treatment of ArF excimer laser light using AIMS193 (manufactured by Carl Zeiss) on when exposure transfer was made on a resist film on a semiconductor device with an exposure light of 193 nm wavelength. The exposure transfer image obtained by this simulation was inspected, recognizing that the design specification was fully satisfied. It can be considered from this result that a highly precise exposure transfer can be made on a resist film on a semiconductor device, even if the phase shift mask 200 manufactured from the mask blank of Example 5 was set on an exposure apparatus and exposure transfer by exposure light of ArF excimer laser was made until accumulated irradiation amount reaches 40 kJ/cm².

On the other hand, a region of the phase shift pattern 2a where the light shielding pattern 3b is stacked in the half tone phase shift mask 200 of Example 5 was subjected to irradiation treatment where ArF excimer laser light was intermittently irradiated until accumulated irradiation amount reached 40 kJ/cm². Secondary ion mass spectrometry (SIMS) was conducted on the phase shift pattern 2a of the region subjected to irradiation treatment, and the phase shift pattern 2a had slight molybdenum content. It can be considered from this result that the phase shift mask 200 manufactured from the mask blank 100 of Example 5 can sufficiently suppress movement of molybdenum in the light shielding pattern 3b into the phase shift pattern 2a when exposure light of ArF excimer laser is irradiated on the phase shift pattern 2a on which the light shielding pattern 3b is stacked.

Comparative Example 1

[Manufacture of Mask Blank]

A mask blank of Comparative Example 1 was manufactured by the same procedure as Example 1, except for a phase shift film 2. The changes made in the phase shift film 2 of Comparative Example 1 are the material forming the lower layer 21 and its film thickness, and the film thickness of the upper layer 22. Concretely, a transparent substrate 1 was placed in a sheet-type RF sputtering apparatus, and by reactive sputtering (RF sputtering) using a silicon(Si) target with a mixed gas of argon(Ar) and nitrogen($N_2$) as a sputtering gas, a lower layer 21 of the phase shift film 2 formed from silicon and nitrogen (SiN film Si:N=52 atomic %:48 atomic %) was formed in contact with a surface of the transparent substrate 1 at a thickness of 22 nm. Subsequently, by reactive sputtering (RF sputtering) using a silicon(Si) target with a mixed gas of argon(Ar) and nitrogen ($N_2$) as a sputtering gas, an upper layer 22 of the phase shift film 2 formed from silicon and nitrogen (SiN film Si:N=43 atomic %:57 atomic %) was formed on the lower layer 21 at a thickness of 42 nm. By the above procedure, the phase shift film 2 with the lower layer 21 and the upper layer 22 stacked in contact with the surface of the transparent substrate 1 was formed at a thickness of 64 nm. The thickness of the upper layer 22 of the phase shift film 2 is 1.9 times the thickness of the lower layer 21.

Further, the phase shift film 2 of Comparative Example 1 was subjected to heat treatment under the same treatment conditions as Example 1. Transmittance and phase difference of the phase shift film 2 to a light of 193 nm wavelength were measured using a phase shift measurement device (MPM193 manufactured by Lasertec), resulting in transmittance of 6.1% and phase difference of 177.0 degrees. Further, the phase shift film 2 was analyzed by STEM and EDX, and formation of an oxidization layer was confirmed on the surface layer portion at a thickness of about 2 nm from the surface of the upper layer 22. Moreover, the optical properties of each of the lower layer 21 and the upper layer 22 of the phase shift film 2 were measured, and the lower layer 21 had refractive index n of 2.39 and extinction coefficient k of 1.17, and the upper layer 22 had refractive index n of 2.63 and extinction coefficient k of 0.37. Back-surface reflectance (reflectance at transparent substrate 1 side) of the phase shift film 2 to light of 193 nm wavelength was 19.5%.

By the above procedure, the mask blank of Comparative Example 1 was manufactured, the mask blank having a structure in which the phase shift film 2 including the lower layer 21 of SiN and the upper layer 22 of SiN, the light shielding film 3, and the hard mask film 4 are stacked on the transparent substrate 1. In the mask blank of Comparative Example 1, back-surface reflectance (reflectance at transparent substrate 1 side) to light of 193 nm wavelength with the phase shift film 2 and the light shielding film 3 stacked on the transparent substrate 1 was 17.8%. The optical density (OD) of the stacked structure of the phase shift film 2 and the light shielding film 3 to a light of 193 nm wavelength was 3.0 or more.

[Manufacture of Phase Shift Mask]

Next, a phase shift mask of Comparative Example 1 was manufactured through the same procedure as Example 1 using the mask blank of Comparative Example 1. The ratio of etching rate of the lower layer 21 to the etching rate of the upper layer 22 when the phase shift film 2 was subjected to dry etching using $SF_6$+He was 0.96.

A region of the phase shift pattern 2a where the light shielding pattern 3b is not stacked in the manufactured half tone phase shift mask of Comparative Example 1 was subjected to irradiation treatment where ArF excimer laser light was intermittently irradiated until accumulated irradiation amount reached 40 kJ/cm². Amount of CD change in the phase shift pattern 2a before and after this irradiation treatment was 3.2 nm. There was no difference in the amount of CD change compared to the amount of CD change in a phase shift pattern formed from a single layer structure of $Si_3N_4$ before and after the same irradiation treatment (3.2 nm), and the amount of CD change has not been improved.

Further, a simulation was made on an exposure transfer image of the phase shift mask after being subjected to the irradiation treatment of ArF excimer laser light using AIMS193 (manufactured by Carl Zeiss) on when exposure transfer was made on a resist film on a semiconductor device with an exposure light of 193 nm wavelength. The exposure transfer image obtained by this simulation was inspected, recognizing that the design specification was not satisfied. It can be considered from this result that a highly precise exposure transfer cannot be made on a resist film on a semiconductor device when the phase shift mask manufactured from the mask blank of Comparative Example 1 was set on an exposure apparatus and exposure transfer by exposure light of ArF excimer laser was made until accumulated irradiation amount reaches 40 kJ/cm².

On the other hand, a region of the phase shift pattern 2a where the light shielding pattern 3b is stacked in the half tone phase shift mask of Comparative Example 1 was subjected to irradiation treatment where ArF excimer laser light was intermittently irradiated until accumulated irradiation amount reached 40 kJ/cm². Secondary ion mass spectrometry (SIMS) was conducted on the phase shift pattern 2a of the region subjected to irradiation treatment, and chromium content of the phase shift pattern 2a was significantly increased compared to the results of each example. It can be considered from this result that the phase shift mask manufactured from the mask blank of Comparative Example 1 cannot suppress movement of chromium in the light shielding pattern 3b into the phase shift pattern 2a when exposure light of ArF excimer laser is irradiated on the phase shift pattern 2a on which the light shielding pattern 3b is stacked.

Comparative Example 2

[Manufacture of Mask Blank]

The mask blank of Comparative Example 2 was manufactured through the same procedure as Example 1, except for a phase shift film 2 and a light shielding film 3. The phase shift film 2 of Comparative Example 2 is changed to a single layer structure. Concretely, a transparent substrate 1 was placed in a sheet-type RF sputtering apparatus, and by reactive sputtering (RF sputtering) using a silicon(Si) target with a mixed gas of argon(Ar) and nitrogen($N_2$) as a sputtering gas, a phase shift film 2 formed from silicon and nitrogen (SiN film Si:N=43 atomic %:57 atomic %) was formed in contact with a surface of the transparent substrate 1 at a thickness of 60 nm.

The optical properties of the phase shift film 2 were measured, and refractive index n was 2.63 and extinction coefficient k was 0.37. However, when the phase shift film 2 of a single layer structure was adjusted at a phase difference of 177.0 degrees, transmittance was 18.1%. For optical density (OD) of the stacked structure of the phase shift film 2 and the light shielding film 3 to light of 193 nm wavelength to be 3.0 or more, composition and optical properties of the light shielding film 3 were kept unchanged but the thickness was changed to 57 nm. Back-surface reflectance (reflectance at transparent substrate 1 side) of the phase shift film 2 to light of 193 nm wavelength was 16.6%.

By the above procedure, a mask blank of Comparative Example 2 was manufactured, the mask blank having a structure where the phase shift film 2 formed from a single layer structure of SiN, the light shielding film 3, and the hard mask film 4 are stacked on the transparent substrate 1. In the mask blank of Comparative Example 2, back-surface reflectance (reflectance at transparent substrate 1 side) to light of 193 nm wavelength in the state where the phase shift film 2 and the light shielding film 3 are stacked on the transparent substrate 1 was 13.7%.

[Manufacture of Phase Shift Mask]

Next, a phase shift mask of Comparative Example 2 was manufactured through the same procedure as Example 1 using the mask blank of Comparative Example 2.

A region of the phase shift pattern 2a where the light shielding pattern 3b is not stacked in the manufactured half tone phase shift mask of Comparative Example 2 was subjected to irradiation treatment where ArF excimer laser light was intermittently irradiated until accumulated irradiation amount reached 40 kJ/$cm^2$. Amount of CD change in the phase shift pattern 2a before and after this irradiation treatment was 3.2 nm.

Further, a simulation was made on an exposure transfer image of the phase shift mask after being subjected to the irradiation treatment of ArF excimer laser light using AIMS193 (manufactured by Carl Zeiss) on when exposure transfer was made on a resist film on a semiconductor device with an exposure light of 193 nm wavelength. The exposure transfer image obtained by this simulation was inspected, recognizing that the design specification was not satisfied. It can be considered from this result that a highly precise exposure transfer cannot be made on a resist film on a semiconductor device when the phase shift mask manufactured from the mask blank of Comparative Example 2 was set on an exposure apparatus and exposure transfer by exposure light of ArF excimer laser was made until accumulated irradiation amount reaches 40 kJ/$cm^2$.

On the other hand, a region of the phase shift pattern 2a where the light shielding pattern 3b is stacked in the half tone phase shift mask of Comparative Example 2 was subjected to irradiation treatment where ArF excimer laser light was intermittently irradiated until accumulated irradiation amount reached 40 kJ/$cm^2$. Secondary ion mass spectrometry (SIMS) was conducted on the phase shift pattern 2a of the region subjected to irradiation treatment, and chromium content of the phase shift pattern 2a was significantly increased compared to the results of each example. It can be considered from this result that the phase shift mask 200 manufactured from the mask blank of Comparative Example 2 cannot suppress movement of chromium in the light shielding pattern 3b into the phase shift pattern 2a when exposure light of ArF excimer laser is irradiated on the phase shift pattern 2a on which the light shielding pattern 3b is stacked.

DESCRIPTION OF REFERENCE NUMERALS 1 transparent substrate
2 phase shift film
21 lower layer
22 upper layer
2a phase shift pattern
3 light shielding film
3a, 3b light shielding pattern
4 hard mask film
4a hard mask pattern
5a first resist pattern
6b second resist pattern
100 mask blank
200 phase shift mask

The invention claimed is:

1. A mask blank comprising a phase shift film on a transparent substrate, wherein:
   a lower layer of the phase shift film is between an upper layer of the phase shift film and a surface of the transparent substrate,
   the lower layer consists of silicon or consists of silicon and one or more elements selected from nonmetallic elements and semimetal elements,
   the upper layer, excluding a surface layer portion thereof, consists of silicon and nitrogen or consists of silicon, nitrogen and one or more elements selected from nonmetallic elements and semimetal elements,
   the lower layer has a refractive index n of less than 1.8 and an extinction coefficient k of 2.0 or more,
   the upper layer has a refractive index n of 2.3 or more and an extinction coefficient k of 1.0 or less,
   a thickness of the upper layer is greater than a thickness of the lower layer, and
   the transparent substrate has a refractive index n of 1.6 or less.

2. The mask blank according to claim 1, wherein the thickness of the lower layer is less than 12 nm.

3. The mask blank according to claim 1, wherein the thickness of the upper layer is at least five times the thickness of the lower layer.

4. The mask blank according to claim 1, wherein the lower layer consists of silicon and nitrogen or consists of silicon, nitrogen and one or more elements selected from nonmetallic elements and semimetal elements.

5. The mask blank according to claim 1, wherein the lower layer has nitrogen content of 40 atomic % or less.

6. The mask blank according to claim 1, wherein nitrogen content of the upper layer is greater than 50 atomic %.

7. The mask blank according to claim 1, wherein the lower layer is formed in contact with the surface of the transparent substrate.

8. The mask blank according to claim 1 comprising a light shielding film on the phase shift film.

9. The mask blank according to claim 8, wherein the light shielding film contains chromium.

10. The mask blank according to claim 8, wherein the light shielding film contains transition metal and silicon.

11. The mask blank according to claim 8, wherein a layer of the light shielding film that contains chromium is between a surface of the phase shift film and a layer of the light shielding film that contains transition metal and silicon.

12. A phase shift mask comprising a phase shift film on a transparent substrate, the phase shift film having a transfer pattern formed thereon, wherein:
 a lower layer of the phase shift film is between an upper layer of the phase shift film and a surface of the transparent substrate,
 the lower layer consists of silicon or consists of silicon and one or more elements selected from nonmetallic elements and semimetal elements,
 the upper layer, excluding a surface layer portion thereof, consists of silicon and nitrogen or consists of silicon, nitrogen and one or more elements selected from nonmetallic elements and semimetal elements,
 the lower layer has a refractive index n of less than 1.8 and an extinction coefficient k of 2.0 or more,
 the upper layer has a refractive index n of 2.3 or more and an extinction coefficient k of 1.0 or less,
 a thickness of the upper layer is greater than a thickness of the lower layer, and
 the transparent substrate has a refractive index n of 1.6 or less.

13. The phase shift mask according to claim 12, wherein the thickness of the lower layer is less than 12 nm.

14. The phase shift mask according to claim 12, wherein the thickness of the upper layer is at least five times the thickness of the lower layer.

15. The phase shift mask according to claim 12, wherein the lower layer consists of silicon and nitrogen or consists of silicon, nitrogen and one or more elements selected from nonmetallic elements and semimetal elements.

16. The phase shift mask according to claim 12, wherein the lower layer has nitrogen content of 40 atomic % or less.

17. The phase shift mask according to claim 12, wherein nitrogen content of the upper layer is greater than 50 atomic %.

18. The phase shift mask according to claim 12, wherein the lower layer is formed in contact with the surface of the transparent substrate.

19. The phase shift mask according to claim 12 comprising a light shielding film having a light shielding pattern formed on the phase shift film.

20. The phase shift mask according to claim 19, wherein the light shielding film contains chromium.

21. The phase shift mask according to claim 19, in which the light shielding film contains transition metal and silicon.

22. The phase shift mask according to claim 19, wherein a layer of the light shielding film that contains chromium is between a surface of the phase shift film and a layer of the light shielding film that contains transition metal and silicon.

23. The phase shift mask according to claim 19, wherein, in a region of the phase shift film where the light shielding film is not present, a back-surface reflectance of the phase shift film to exposure light at an interface with the transparent substrate is 35% or more.

24. The phase shift mask according to claim 19, wherein, in a region of the phase shift film where the light shielding film is present, a back-surface reflectance of the phase shift film to exposure light at an interface with the transparent substrate is 30% or more.

25. A method for manufacturing a semiconductor device comprising using a phase shift mask and exposure-transferring a transfer pattern on a resist film on a semiconductor substrate, the phase shift mask comprising:
 a phase shift film on a transparent substrate and having the transfer pattern formed thereon; and
 a light shielding film formed on the phase shift film and having a light shielding pattern, wherein:
 a lower layer of the phase shift film is between an upper layer of the phase shift film and a surface of the transparent substrate,
 the lower layer consists of silicon or consists of silicon and one or more elements selected from nonmetallic elements and semimetal elements,
 the upper layer, excluding a surface layer portion thereof, consists of silicon and nitrogen or consists of silicon, nitrogen and one or more elements selected from nonmetallic elements and semimetal elements,
 the lower layer has a refractive index n of less than 1.8 and an extinction coefficient k of 2.0 or more,
 the upper layer has a refractive index n of 2.3 or more and an extinction coefficient k of 1.0 or less,
 a thickness of the upper layer is greater than a thickness of the lower layer, and
 the transparent substrate has a refractive index n of 1.6 or less.

* * * * *